(12) United States Patent
Toh et al.

(10) Patent No.: US 8,647,924 B2
(45) Date of Patent: Feb. 11, 2014

(54) SEMICONDUCTOR PACKAGE AND METHOD OF PACKAGING SEMICONDUCTOR DEVICES

(75) Inventors: Chin Hock Toh, Singapore (SG); Keng Yuen Au, Singapore (SG); Reynaldo Vincent Hernandez Sta Agueda, Singapore (SG); Bee Liang Catherine Ng, Singapore (SG); Librado Amurao Gatbonton, Singapore (SG); Xue Ren Zhang, Singapore (SG); Yi-Sheng Anthony Sun, San Jose, CA (US)

(73) Assignee: United Test and Assembly Center Ltd., Singapore (SG)

( * ) Notice: Subject to any disclaimer, the term of this patent is extended or adjusted under 35 U.S.C. 154(b) by 468 days.

(21) Appl. No.: 12/758,820

(22) Filed: Apr. 13, 2010

(65) Prior Publication Data

US 2010/0261313 A1    Oct. 14, 2010

Related U.S. Application Data

(60) Provisional application No. 61/168,917, filed on Apr. 13, 2009.

(51) Int. Cl.
*H01L 21/00* (2006.01)

(52) U.S. Cl.
USPC .... 438/109; 438/106; 438/110; 257/E21.499; 257/E21.599

(58) Field of Classification Search
USPC .................. 438/106, 109, 110; 257/E21.499, 257/E21.599
See application file for complete search history.

(56) References Cited

U.S. PATENT DOCUMENTS

| | | | |
|---|---|---|---|
| 6,492,195 B2 * | 12/2002 | Nakanishi et al. | 438/106 |
| 7,317,247 B2 * | 1/2008 | Lee et al. | 257/706 |
| 7,560,302 B2 * | 7/2009 | Egawa | 438/106 |
| 2009/0011540 A1 * | 1/2009 | Doan | 438/109 |
| 2009/0039496 A1 * | 2/2009 | Beer et al. | 257/693 |

* cited by examiner

*Primary Examiner* — Kimberly Rizkallah
*Assistant Examiner* — Caleb Henry
(74) *Attorney, Agent, or Firm* — Horizon IP Pte. Ltd.

(57) ABSTRACT

A method of forming a device stack is presented. The method includes providing a temporary substrate having a temporary mounting surface. A first chip is temporarily mounted to the temporary mounting surface. A first bottom surface of the first chip is temporarily mounted to the temporary mounting surface and a first top surface of the first chip comprises first interconnects. A second chip is stacked on the first chip. The second chip includes second conductive contacts on the second bottom surface. The method also includes bonding the first and second chips together to form the device stack. The second conductive contacts are coupled to the first interconnects. The first bottom surface of the first chip is separated from the substrate to separate the chip stack from the substrate.

23 Claims, 22 Drawing Sheets

SEMICONDUCTOR PACKAGE AND METHOD OF PACKAGING SEMICONDUCTOR DEVICES

CROSS REFERENCE TO RELATED APPLICATIONS

The application claims priority of U.S. Provisional Application No. 61/168,917 entitled "Semiconductor Package and Method of Packaging Semiconductor Devices" filed on Apr. 13, 2009, which is herein incorporated by reference for all purposes.

BACKGROUND

Vertical stacking of multiple flip chips in stacked die packages is frequently used in the semiconductor manufacturing. Such method requires chips to be processed with through silicon interconnects to enable electrical connection between the stacked chips. The through silicon interconnects may typically be formed by creating vias that extend from the inactive or backside of the chip to the active or front side of the chip, and subsequently filling the vias with a conductive material such as copper.

The stacking may be performed at the wafer level in which the through silicon interconnects are formed on a plurality of wafers, and the plurality of wafers are stacked to form a wafer stack. The wafer stack may be singulated into individual units which can be further processed (i.e., mounting onto a substrate, molding and solder ball mounting) to form a semiconductor package. However, a disadvantage of such a method is that some of the dies in the wafer stack may be defective, thereby resulting in packages with defective dies.

There is therefore a desire to provide an efficient method of forming stacked die packages having known good dies.

SUMMARY

A method of forming devices is disclosed. The method includes providing a temporary substrate having a temporary mounting surface. A plurality of first chips are temporarily mounted to the temporary mounting surface. A first chip includes a first bottom surface and a first top surface with first interconnects. First bottom surfaces of the first chips are temporarily mounted to the temporary mounting surface. The method also includes stacking second chips on the first top surfaces of the first chips. A second chip includes a second bottom surface with second conductive contacts. The second conductive contacts of the second chips are coupled to the first interconnects on the first top surfaces of the first chips. The method also includes bonding the first and second chips together to form a plurality of chip stacks. The first bottom surfaces of the first chips are separated from the temporary substrate to separate the chip stacks from the temporary substrate.

In another embodiment, a method of forming a device stack is presented. The method includes providing a temporary substrate having a temporary mounting surface. A first chip is temporarily mounted to the temporary mounting surface. A first bottom surface of the first chip is temporarily mounted to the temporary mounting surface and a first top surface of the first chip comprises first interconnects. A second chip is stacked on the first chip. The second chip includes second conductive contacts on the second bottom surface. The method also includes bonding the first and second chips together to form the device stack. The second conductive contacts are coupled to the first interconnects. The first bottom surface of the first chip is separated from the substrate to separate the chip stack from the substrate.

In yet another embodiment, a method of forming devices is disclosed. The method includes providing a temporary substrate having a temporary mounting surface. A plurality of first chips are temporarily mounted to the temporary mounting surface. A first chip includes a first bottom surface and a first top surface with first interconnects. First bottom surfaces of the first chips are temporarily mounted to the temporary mounting surface. Second chips are stacked on the first top surfaces of the first chips. A second chip includes a second bottom surface with second conductive contacts and a second top surface with second interconnects. The second conductive contacts are coupled to the second interconnects by second through silicon interconnects. The second conductive contacts of the second chips are coupled to the first interconnects on the first top surfaces of the first chips. Third chips are stacked on top surfaces of the second chips. A third chip includes a third bottom surface with third conductive contacts. The third conductive contacts of the third chips are coupled to the second interconnects on the second top surfaces of the second chips. The method also includes bonding the first, second and third chips together to form a plurality of chip stacks. The first bottom surfaces of the first chips are separated from the temporary substrate to separate the chip stacks from the temporary substrate.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to assembling or packaging semiconductor chips or integrated circuits (ICs). Various types of chips can be packaged. For example, the chips can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The chips or ICs can be incorporated into various types of products. For example, the chips may be incorporated into electronic products or equipments such as phones, computers and personal digital assistants. Incorporating the chips into other products may also be useful.

Figure 1A:
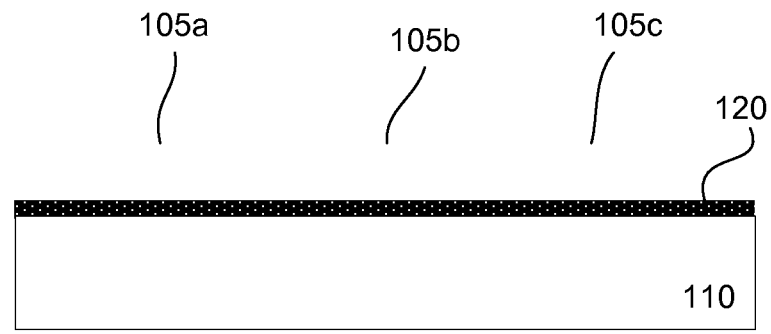
FIGS. 1a-i show a process of forming a semiconductor package.

FIGS. 1a-i show an embodiment of a process 100 for forming a semiconductor or chip assembly. In one embodiment, the chip assembly comprises a stacked chip assembly. A chip stack assembly includes x number of chips, where x≥2 and 1 is the bottom chip of the stack and x is the top chip of the stack. Referring to FIG. 1a, a substrate 110 is provided. The substrate serves as a base carrier for assembling chips. Various types of materials may be used to form the substrate. The material of the substrate should be sufficiently rigid to serve as a support and withstand further processing steps. For example, the substrate should be sufficiently rigid to reduce or prevent warpage of chip assemblies during the assembly process. In one embodiment, the base carrier comprises copper, glass, silicon, quartz, or sapphire. Other types of materials may also be useful.

The substrate includes an assembly surface on which one or more chip assemblies are formed. The base carrier may be configured as a single unit format for one chip assembly. Other types of formats, such as strip or wafer, may also be useful. Format selection may depend on, for example, the requirements of the assembly process. Illustratively, the substrate is configured in a strip format with three chip regions or zones 105a-c to accommodate three chip assemblies. Providing a substrate having other number of chip zones or other formats may also be useful.

An adhesive 120 is provided on the chip assembly surface of the base carrier. The adhesive is provided in at least the chip zones of the substrate for temporarily mounting a chip assembly thereto. For example, the adhesive is provided in at least a portion or in the complete chip zones to sufficiently temporarily fix the chip assembly to the chip zones. In other embodiments, the adhesive may be provided on the whole assembly surface of the substrate. The adhesive can be any type of adhesive that provides temporary bonding of a chip assembly to the chip assembly surface.

Various types of adhesives may be used. The adhesive may be in different forms. For example, the adhesive may be a tape, a liquid or a paste. The adhesive may be provided on the substrate using various techniques. The technique employed may depend on the type or form of the adhesive. For example, a tape adhesive may be provided on the substrate by lamination, a paste adhesive may be provided on the substrate by printing while a liquid adhesive may be provided on the substrate by spin-coating. Providing the adhesive on the substrate using other techniques may also be useful.

The adhesive is used to temporarily attach a chip to the chip assembly surface of the substrate. A de-bonding treatment is employed to separate the chip from the chip assembly surface. The de-bonding treatment may, for example, cause the adhesive to lose or reduce its adhesive strength to allow separation of a chip assembly from the substrate. In one embodiment, the de-bonding treatment comprises a temperature or heating treatment. When heated to the de-bonding temperature, the adhesive loses or reduces its adhesive strength. Other types of de-bonding treatments may also be useful. The de-bonding treatment may depend on the type of adhesive used. The de-bonding treatment, for example, may comprise applying a solvent to dissolve the adhesive or a mechanical treatment, such as pulling or twisting to separate the chip from the substrate.

In one embodiment, the adhesive comprises a thermoplastic adhesive. For example, the adhesive may comprise Wafer-BOND™ HT10.10 from Brewer Science, Inc.® The adhesive may be provided on the substrate by a spin coating process. Other coating processes may also be useful to provide the adhesive on the substrate surface.

In another embodiment, the adhesive may comprise an adhesive tape. For example, the adhesive tape may comprise REVALPHA tape from Nitto Denko. The de-bonding temperature of the tape may be about 90-150° C., depending on the model of the tape. For example, some models of the tape may have a de-bonding temperature of 90° C., 120° C. or 150° C. The tape may be provided on the base carrier by lamination. Other methods that can coat the adhesive over the surface of the base carrier may also be useful. In alternative embodiments, other types of adhesive may be used.

Alternatively, other temporary bonding techniques may be employed to temporarily bond a chip assembly to the carrier.

Figure 1B:
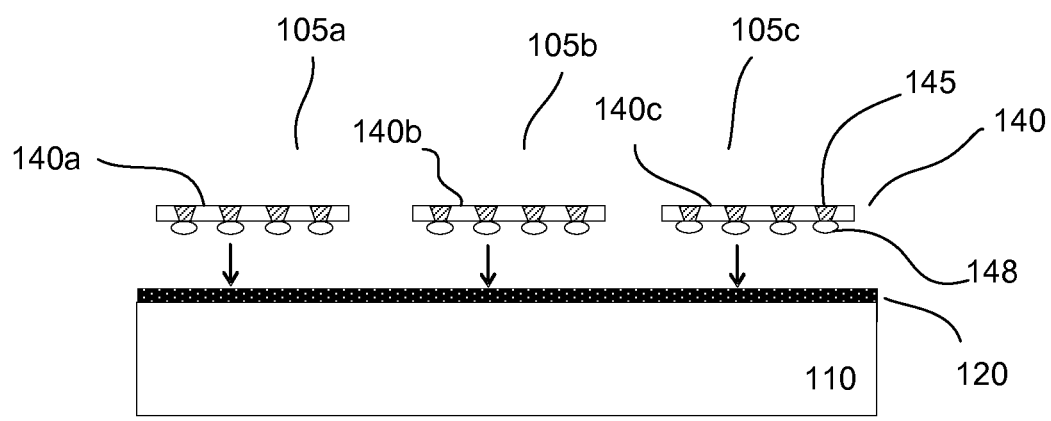

In FIG. 1b, the process commences to form chip assemblies in the chip regions of the carrier. First chips 140a-c are provided. The first chip serves as a bottom or lowest chip of a chip stack. In one embodiment, a bottom chip includes through silicon interconnects 145 extending from a first surface to an opposing second surface of the chip. The first surface, for example, is the top surface and the second surface is the bottom surface. The through silicon interconnects may be formed using various techniques. For example, the through silicon interconnects may be formed by forming vias through the chip and filling the vias with a conductive material, such as copper. Forming the through silicon interconnects using other techniques or using other types of conductive materials may also be useful. A through silicon interconnect may be formed in any location on the chip. The location may depend on, for example, the chip layout or design requirements.

Conductive contacts 148 are provided on the first or second surface. In one embodiment, the conductive contacts are provided on the bottom surface. The conductive contacts 148 can, for example, be a ball bump made of solder. Other types of conductive contacts may also be useful. For example, the conductive contacts can also be conductive pads made of copper, tin, gold or alloys thereof. Other materials can also be used.

The conductive contacts are coupled to the through silicon interconnects. In one embodiment, the conductive contacts are coupled to the ends of the through silicon interconnects directly. For example, conductive contacts are provided in the periphery of the bottom surface of the chip which directly contacts the through silicon interconnects. Alternatively, the conductive contacts may be indirectly coupled to the through silicon interconnects. For example, the conductive contacts may be coupled to the through silicon interconnects by a redistribution layer (RDL).

The first chips are temporarily mounted onto the assembly surface of the base carrier. In one embodiment, the bottom surfaces of the first chips are temporarily mounted onto the assembly surface of the base carrier. When placed onto the substrate, the contacts of the first chips, for example, are partially immersed in the adhesive. Completely immersing the contacts in the adhesive may also be useful. The adhesive temporarily bonds the first chips to the chip assembly surface of the base carrier.

The substrate, depending on the type of adhesive used, may be subjected to a chip mounting treatment. The chip mounting treatment may be used to soften the adhesive. The chip mounting treatment may comprise a temperature or heat treatment. For example, heat treatment may be performed at the de-bonding temperature of the adhesive for Wafer-BOND™ HT10.10 from Brewer Science, Inc.® or REVALPHA tape from Nitto Denko. For such adhesives, the de-bonding temperature may be, for example, about 90-230° C., depending on the type of adhesive. Performing the mounting treatment at other temperatures may also be useful. The temperature of the mounting treatment should be below the melting or reflow temperature of the conductive contacts. The mounting treatment may be performed before, while or after placement of the chips on the substrate. Other types of chip mounting treatment may also be useful. For example, the chip mounting treatment may depend on the adhesive or temporary attachment technique used.

Figure 1C:
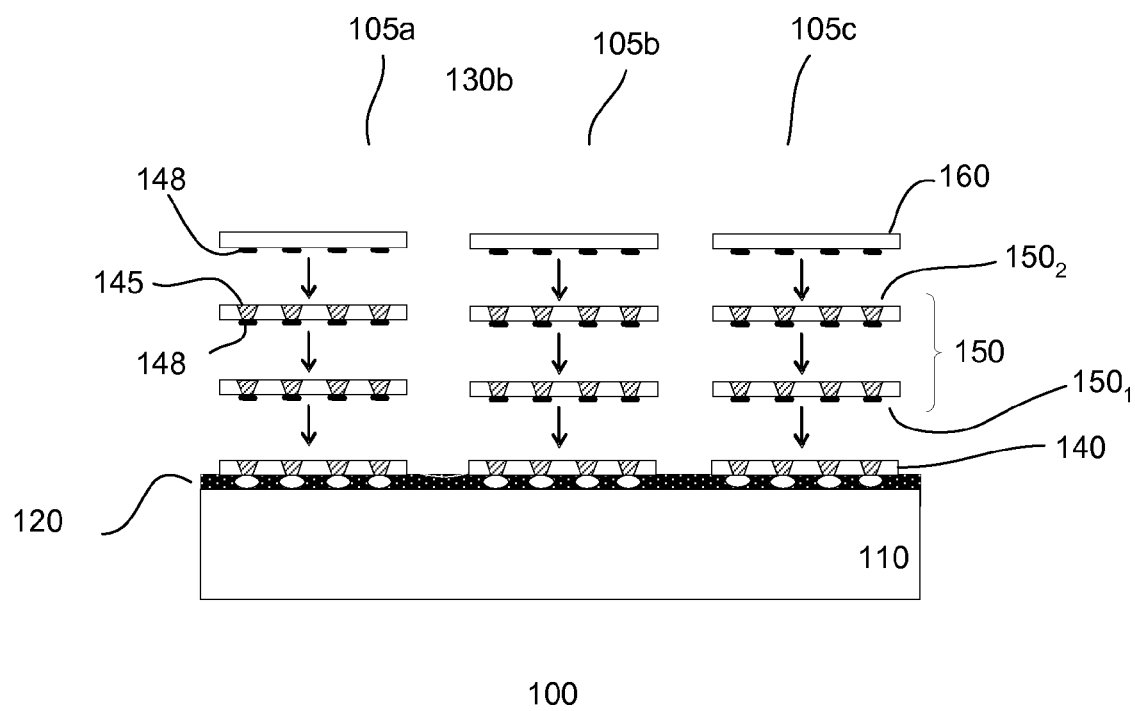

As shown in FIG. 1c, additional chips of the chip stacks are provided. In one embodiment, second or intermediate chips of the chip stacks may be provided. Illustratively, two intermediate chips $150_1$ and $150_2$ are provided for a chip stack. Providing other number of intermediate chips for a stack, including zero, may also be useful. The intermediate chips may be similar to the bottom chips. For example, the intermediate chips include through silicon interconnects 145 and conductive contacts 148 on their bottom surfaces. In one embodiment, a top surface of the intermediate chips is exposed. The exposed surface includes the interconnects.

In one embodiment, third or top chips 160 are provided for the chip stacks. Top chips at least include conductive contacts 148 on its bottom surface. Illustratively, the top chips do not include through silicon interconnects. In other embodiments, the top chips may be provided with through silicon interconnects. In such case, the top chips may be similar or identical to the intermediate chips. The top surface of the top chip, in one embodiment, is exposed.

The various chips of a chip stack assembly may be the same or different types of chips. Other configurations of the chips of the chip stack assembly may also be useful. For example, some of the chips may be different while others may be the same.

The $n^{th}$ chip of the chip stack, where $n \neq 1$ is placed on the $n^{th}-1$ chip. For example, the conductive contacts of the $n^{th}$ chip is placed and aligned with the through silicon interconnects of the $n^{th}-1$ chip. In an alternative embodiment, an RDL may be provided on either the top surface or bottom surface of the chip to facilitate alignment or coupling of conductive contacts of the $n^{th}$ chip to the through silicon interconnects of the $n^{th}-1$ chip.

Figure 1D:
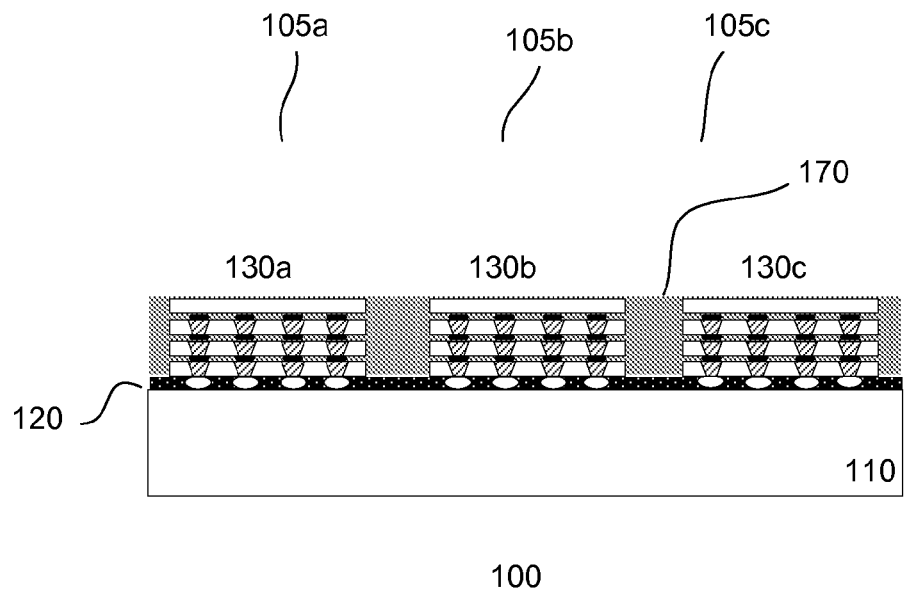

A chip bonding process is performed to bond the chips of a chip stack together to form chip stack assemblies 130a-c, as shown in FIG. 1d. In one embodiment, the chip bonding process comprises applying heat and/or pressure on the chip stack. For example, thermo-compression or gang pressing may be performed to fuse the conductive contacts of the $n^{th}$ chip with the interconnects of the $n^{th}-1$ chip. Other bonding techniques may also be useful. For example, in applications where the conductive contacts are solder bumps, the bonding may be performed by securing the chips 140, 150 and 160 in a vertical stack using flux material and then reflowing the solder bumps.

Preferably, the temperature of the chip bonding process should not exceed the de-bonding temperature of the adhesive. This prevents the adhesive from losing its adhesive properties, dislodging the chip assemblies from the base carrier. In one embodiment, the bonding temperature may be less than 90-230° C. For example, the temperature of the chip bonding process may be less than 190° C. for WaferBOND™ HT10.10 thermoplastic adhesives while less than 90° C., 120° C. or 150° C. for REVALPHA tape, depending on the model. Performing the chip bonding process at other temperatures may also be useful, for example, depending of the adhesive or temporary bonding technique employed. The temperature of the chip bonding process should also be below the melting or reflow temperature of the conductive contacts of the chips.

In one embodiment, a resin 170 is provided into spaces between the stacked chip assemblies. The resin also fills the gaps between the chip assemblies, covering the sides thereof. In one embodiment, the resin comprises a top surface which is coplanar with the top surface of the chip assemblies. Alternatively, the resin may cover the top surface of the chip assemblies and fill the gaps therebetween. The resin may have a low coefficient of thermal expansion (CTE) to avoid or reduce warpage of the chip assembly. The CTE of the resin may be the same or close to that of the chip. For example, the CTE of the resin may be the same or close to that of silicon. Other CTEs may also be useful. In one embodiment, the resin comprises an epoxy resin mold compound. Other kinds of mold compositions may also be useful.

Figure 1E:
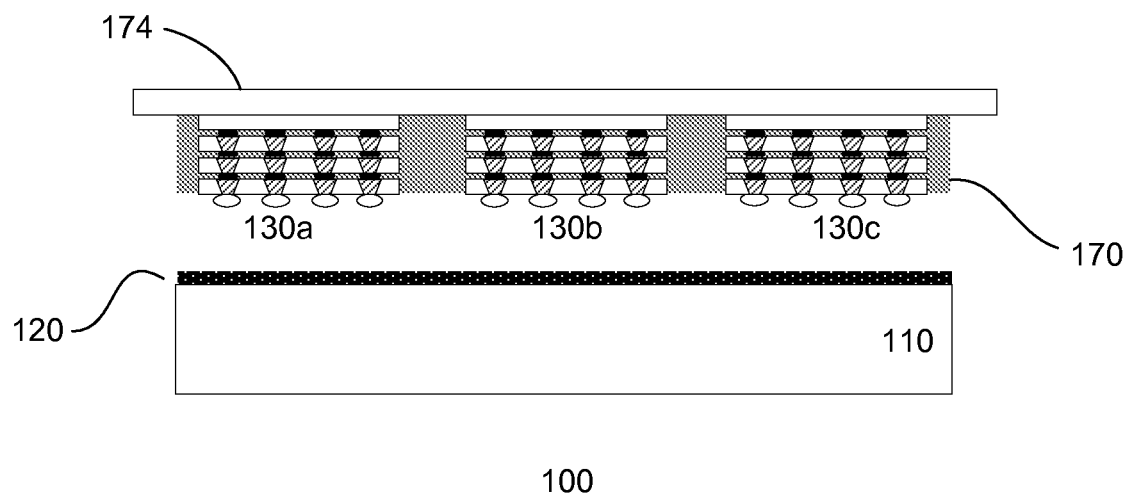

Referring to FIG. 1e, a de-bonding process is performed to separate the first chips of the chip assemblies from the substrate. The de-bonding treatment may, for example, cause the adhesive to lose or reduce its adhesive strength to allow separation of a chip assembly from the substrate. In one embodiment, the de-bonding process comprises a temperature or heating treatment. When heated to the de-bonding temperature, the adhesive loses or reduces its adhesive strength. For the case of a WaferBOND™ HT10.10 adhesive from Brewer Science, Inc.® or REVALPHA tape from Nitto Denko, the de-bonding temperature, for example, may be about 90-230° C., depending on the type or model of the adhesive used. Performing the de-bonding process at other temperatures may also be useful. The temperature of the de-bonding process should be below the melting or reflow temperature of the conductive contacts.

Other types of de-bonding processes may also be useful. The de-bonding process may depend on the adhesive or temporary attachment technique used. The de-bonding process, for example, may be a chemical or mechanical treatment.

Subjecting the assembly unit to the de-bonding process causes the adhesive to lose its adhesive strength, allowing the chip assemblies with the resin to be separated from the base carrier. To facilitate the de-bonding process, the top surfaces of the chip assemblies with the resin may be locked into a rigid frame 174. The rigid frame is lifted to separate the chip assemblies from the base carrier. The rigid frame can be, for example, a wafer chuck for de-bonding. The base carrier 100 may be cleaned thereafter to remove the adhesive, and be recycled for further use.

Figure 1F:
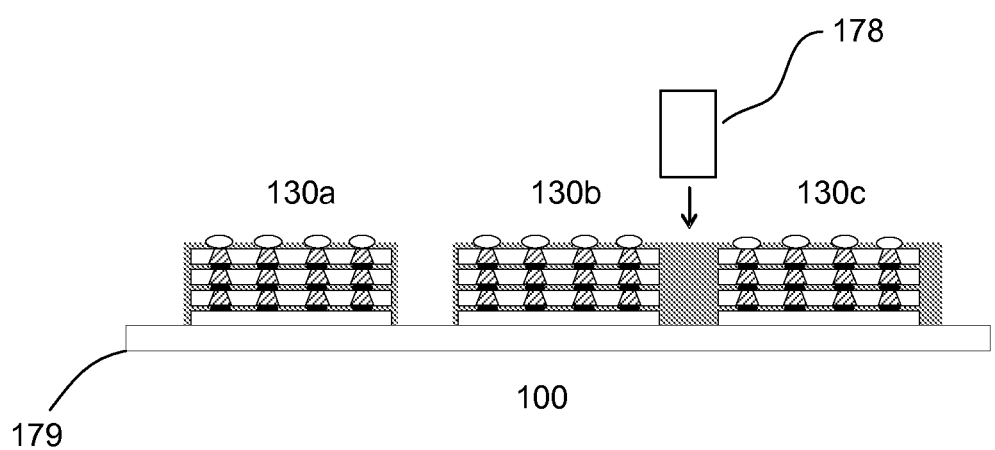
Figure 1G:
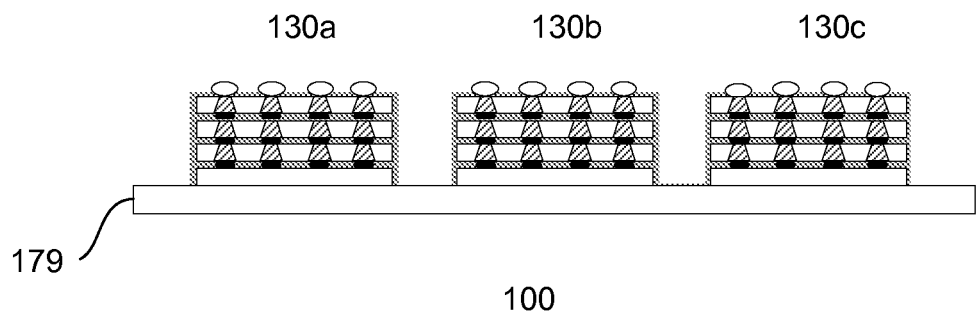

As shown in FIG. 1f, a singulation process is performed to form individual chip assemblies 130a-c. In one embodiment, the chip assemblies with the resin are mounted onto a dicing ring 179. To mount the chip assemblies onto the dicing ring, a dicing tape may be employed. A saw 178 saws the resin between the chip assemblies, separating them. Other techniques can also be used for singulation. FIG. 1g shows the stacked chip assemblies 130a-c after completing the singulation process.

Figure 1H:
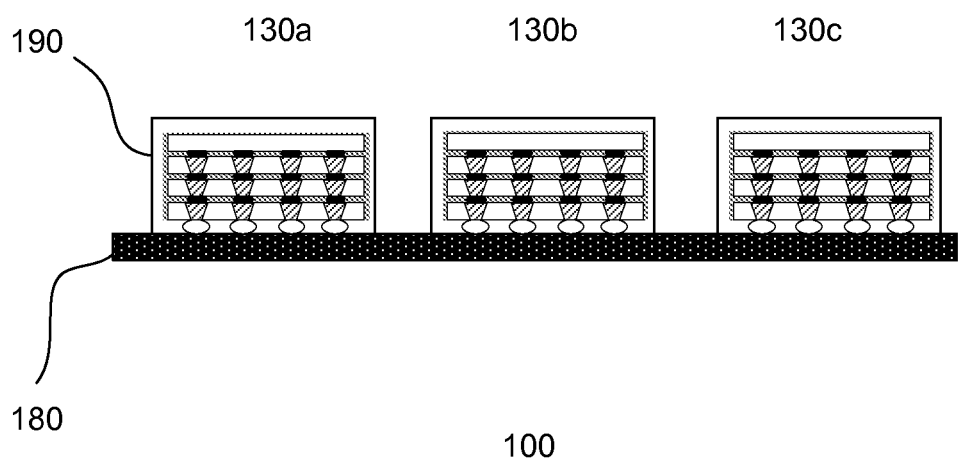

Referring to FIG. 1h, the stacked chip assemblies 130a-c may optionally be mounted onto a substrate 180 and the conductive contacts 148 are reflowed to secure electrical connections between the bottom chips 140 and the substrate 180. The substrate can, for example, be a laminate substrate such as a bismaleimide triazine (BT) substrate. Other types of substrate can also be used. The stacked chip assemblies are encapsulated in a mold compound 190. The mold compound also occupies space between the bottom chip 140 and the substrate 180 and covers the conductive contacts 148 therebetween. The mold compound comprises a material used for encapsulating semiconductor devices. Various types of mold compounds can be used, for example, plastic molding compounds or rubber molding compounds may be used to encapsulate the chip assemblies.

Figure 1I:
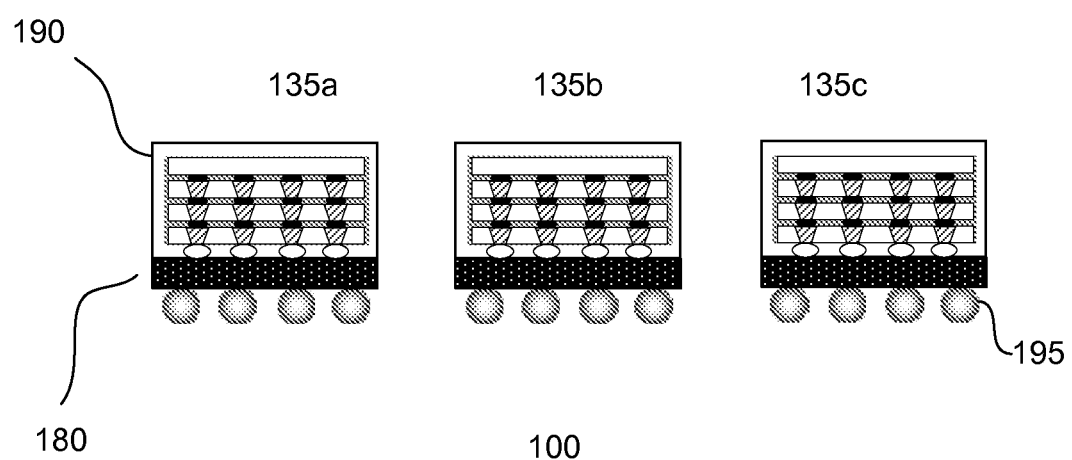

As shown in FIG. 1*i*, solder balls 195 are provided on the bottom surface of the substrate 180 to enable electrical connection to an external device such as a circuit board. The solder balls can be in different alloy, for example, Sn—Ag or Sn—Cu. Other materials can also be used. The solder balls can be attached to the bottom surface of the substrate by heating or laser soldering. Other methods can also be useful. The substrate 180 is singulated to form individual semiconductor packages 135*a*-*c*.

As such, a stacked die semiconductor package is formed. It will be appreciated that the individual chip assemblies need not be mounted onto the substrate and may be directly connected to the external device such as a circuit board, depending on the applications of the chips.

The process, as described, results in advantages. For example, known good dies may be selected from the wafer to form the chip assemblies, thereby reducing instances of failed packages. Also, after forming the chip assemblies on the base carrier, the procedures that follow can be performed at the wafer level (i.e., processing in multiple units), thereby reducing manufacturing time as compared to if the packages were assembled unit by unit. The wafers may be pre-processed by wafer suppliers to include the through silicon interconnects, underbump metallizations, passivation layers, and conductive contacts (e.g., conductive bumps or conductive pads) before undergoing assembly at the assembly houses, thereby simplifying the assembly process. Therefore, there is no need for such steps to be carried out during assembly. Additionally, the base carrier can be recycled.

Figure 2A:
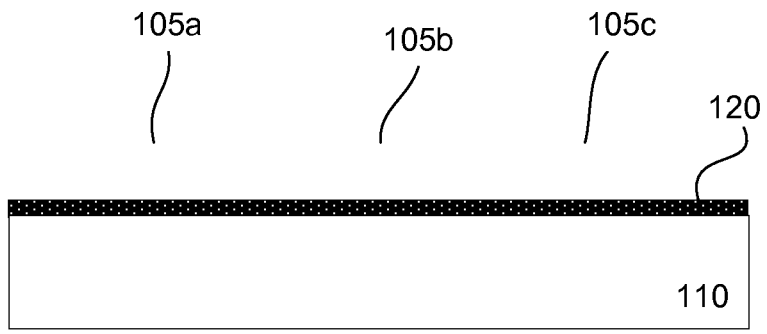
FIGS. 2a-g show an alternative process of forming a semiconductor package.

FIGS. 2*a*-*g* show another embodiment of a process 200 for forming a semiconductor or chip assembly. In one embodiment, the chip assembly comprises a stacked chip assembly. Referring to FIG. 2*a*, a substrate 110 is provided with an adhesive 120 on a chip assembly surface thereof. The substrate with the adhesive is similar to that described in, for example, FIG. 1*a*. The adhesive is used to temporarily bond a chip assembly to the chip assembly surface. Alternatively, other temporary bonding techniques may be employed to temporarily bond a chip assembly to the carrier.

Figure 2B:
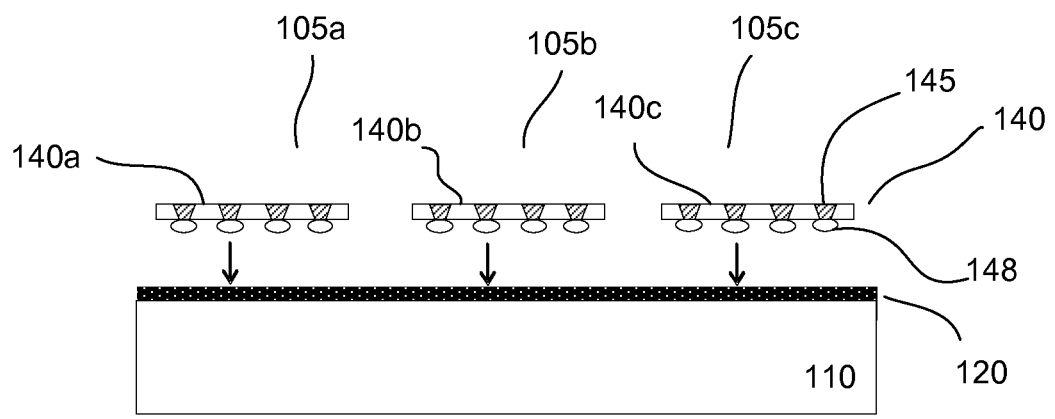

In FIG. 2*b*, first chips 140*a*-*c* are provided. The first chip serves as a bottom or lowest chip of a chip stack. The first chips are temporarily mounted onto the chip assembly surface of the substrate, similar to that described in, for example, FIG. 1*b*.

Figure 2C:
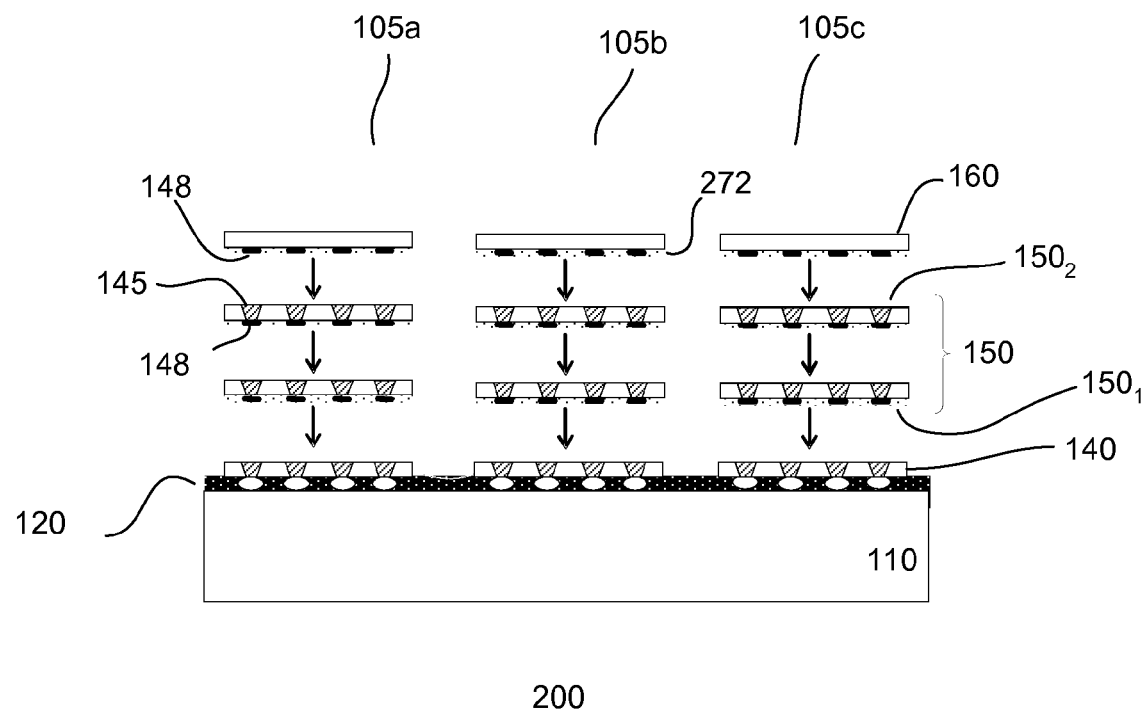

As shown in FIG. 2*c*, additional chips of the chip stacks are provided. In one embodiment, second or intermediate chips of the chip stacks may be provided. Illustratively, two intermediate chips $150_1$ and $150_2$ are provided for a chip stack. Providing other number of intermediate chips for a stack, including zero, may also be useful. The intermediate chips may be similar to the bottom chips. For example, the intermediate chips include through silicon interconnects 145 and conductive contacts 148 on their bottom surfaces. In one embodiment, a top surface of the intermediate chips is exposed. The exposed surface includes the interconnects.

In one embodiment, bottoms of the second chips are provided with an underfill 272. The underfill layer 272 may be applied to the bottom surfaces of the intermediate chips. The underfill layer may be substantially flushed with the conductive contacts 148. The underfill layer, for example, can comprise a resin. Other types of material can also be useful. The underfill layer preferably has a low coefficient of thermal expansion (CTE) to avoid or reduce warpage of the chips of the chip assemblies. The CTE of the resin may be the same or close to that of the chip. For example, the CTE of the resin may be the same or close to that of silicon. Providing an underfill layer with other CTEs may also be useful. In one embodiment, the resin comprises an epoxy resin mold compound. Other kinds of underfill compositions may also be useful.

In one embodiment, third or top chips 160 are provided for the chip stacks. Top chips at least include conductive contacts 148 on its bottom surface. An underfill layer 272 may be applied to the bottom surfaces of the top chips. Illustratively, the top chips do not include through silicon interconnects. In other embodiments, the top chips may be provided with through silicon interconnects. In such case, the top chips may be similar or identical to the intermediate chips. The top surface of the top chip, in one embodiment, is exposed.

The $n^{th}$ chip of the chip stack, where $n \neq 1$ is placed on the $n^{th}-1$ chip. For example, the conductive contacts of the $n^{th}$ chip is placed and aligned with the through silicon interconnects of the $n^{th}-1$ chip. In an alternative embodiment, an RDL may be provided on either the top surface or bottom surface of the chip to facilitate alignment or coupling of conductive contacts of the $n^{th}$ chip to the through silicon interconnects of the $n^{th}-1$ chip.

The various chips of a chip stack assembly may be the same or different types of chips. Other configurations of the chips of the chip stack assembly may also be useful. For example, some of the chips may be different while others may be the same.

Figure 2D:
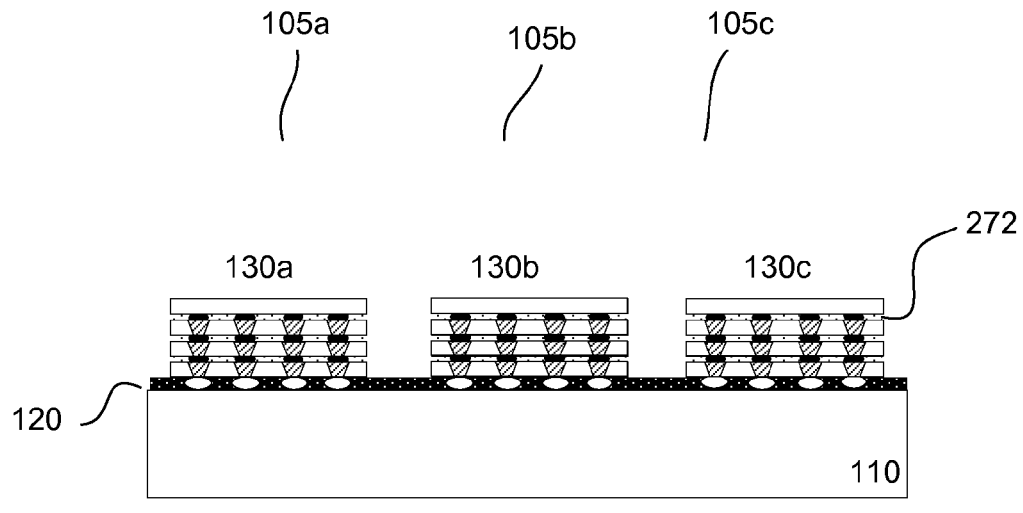

The chips of a chip stack are bonded together to form chip stack assemblies 130*a*-*c*, as shown in FIG. 2*d*. The chip bonding process is similar to that already described in, for example, FIG. 1*d*.

Figure 2E:
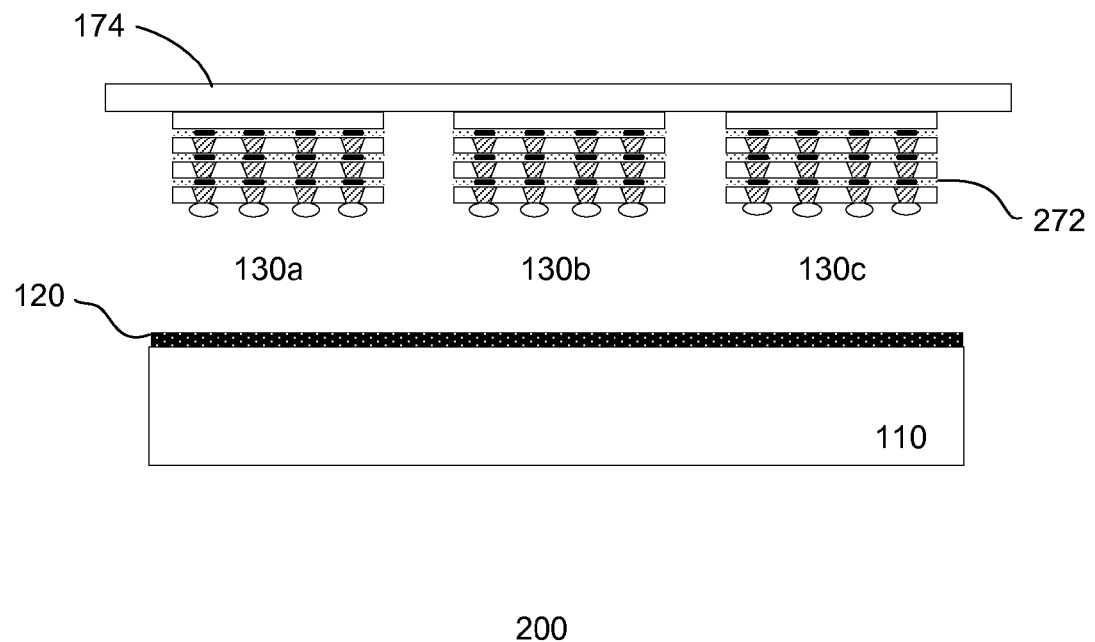

Referring to FIG. 2*e*, a de-bonding process is performed. In one embodiment, the de-bonding process comprises subjecting the assembly unit, which includes the base carrier with the stacked chip assemblies, to a temperature process. The de-bonding process is similar to that described in, for example, FIG. 1*e*. To facilitate the de-bonding process, the top surfaces of the chip assemblies may be locked into a rigid frame 174. The rigid frame is lifted to separate the chip assemblies from the base carrier. The rigid frame can be, for example, a wafer chuck for de-bonding. The base carrier 100 may be cleaned thereafter to remove the adhesive, and be recycled for further use.

Figure 2F:
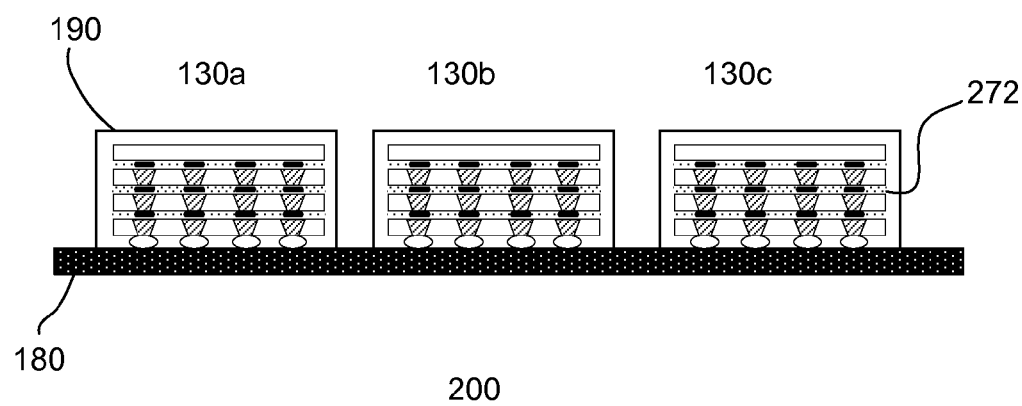

Referring to FIG. 2*f*, the stacked chip assemblies 130*a*-*c* may optionally be mounted onto a substrate 180 and the conductive contacts 148 are reflowed to secure electrical connections between the bottom chips 140 and the substrate 180. The substrate can, for example, be a laminate substrate such as a bismaleimide triazine (BT) substrate. Other types of substrate can also be used. The stacked chip assemblies are encapsulated in a mold compound 190. The mold compound also occupies space between the bottom chip 140 and the substrate 180 and covers the conductive contacts 148 therebetween. The mold compound comprises a material used for encapsulating semiconductor devices. Various types of mold compounds can be used, for example, plastic molding compounds or rubber molding compounds may be used to encapsulate the chip assemblies.

Figure 2G:
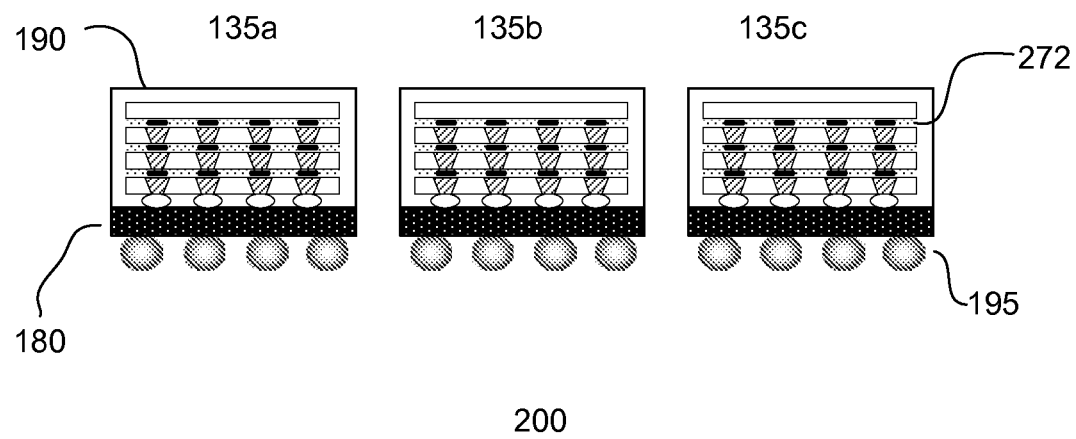

As shown in FIG. 2*g*, solder balls 195 are provided on the bottom surface of the substrate 180 to enable electrical connection to an external device such as a circuit board. The solder balls can be in different alloy, for example, Sn—Ag or Sn—Cu. Other materials can also be used. The solder balls can be attached to the bottom surface of the substrate by heating or laser soldering. Other methods can also be useful. The substrate 180 is singulated to form individual semiconductor packages 135a-c.

As such, a stacked die semiconductor package is formed. It will be appreciated that the individual chip assemblies need not be mounted onto the substrate and may be directly connected to the external device such as a circuit board, depending on the applications of the chips.

The process described in FIGS. 2a-g has the same or similar advantages as the process described in FIGS. 1a-i. In addition, by providing a pre-applied underfill material before stacking of the chips, the process reduces assembly steps. For example, the steps related to filling the chip assemblies with a resin and singulating the chip assemblies from the resin, as described in FIG. 1f, can be avoided.

Figure 3A:
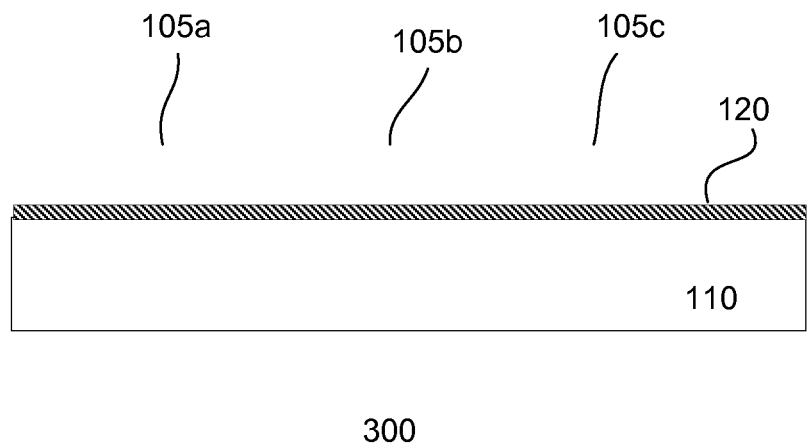
FIGS. 3a-g show yet another process of forming a semiconductor package.

FIGS. 3a-g show another embodiment of a process 300 for forming a semiconductor or chip assembly. In one embodiment, the chip assembly comprises a stacked chip assembly. Referring to FIG. 3a, a substrate 110 is provided with an adhesive 120 on a chip assembly surface thereof. The substrate with the adhesive is similar to that described in, for example, FIG. 1a. The adhesive is used to temporarily bond a chip assembly to the chip assembly surface. Alternatively, other temporary bonding techniques may be employed to temporarily bond a chip assembly to the carrier.

Figure 3B:
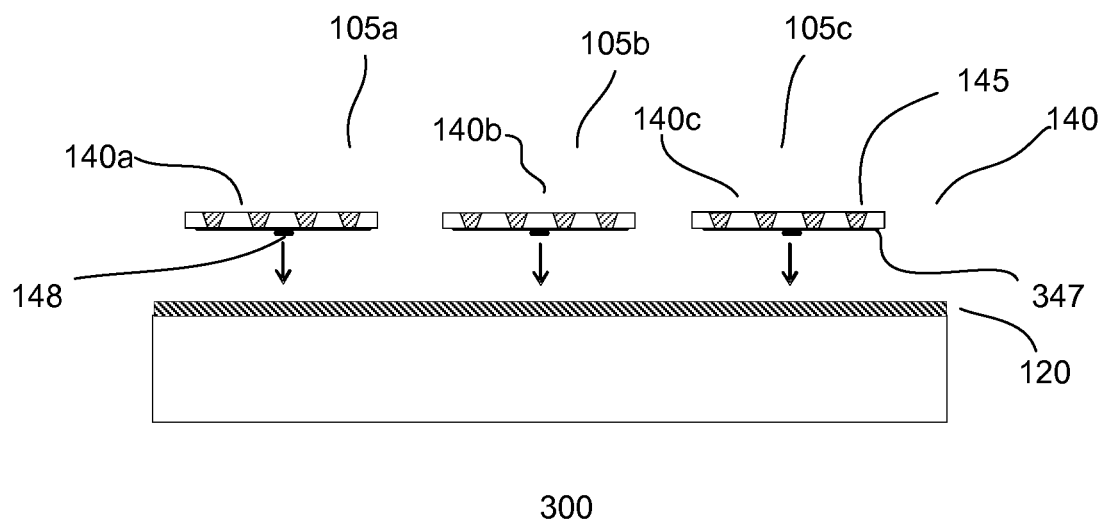

In FIG. 3b, first chips 140a-c are provided. The first chip serves as a bottom or lowest chip of a chip stack. In one embodiment, a bottom chip includes through silicon interconnects 145 extending from a first surface to an opposing second surface of the chip. The first surface, for example, is the top surface and the second surface is the bottom surface. The through silicon interconnects may be formed using various techniques. For example, the through silicon interconnects may be formed by forming vias through the chip and filling the vias with a conductive material, such as copper. Forming the through silicon interconnects using other techniques or using other types of conductive materials may also be useful.

Conductive contacts 148 are provided on the first or second surface. In one embodiment, the conductive contacts are disposed in a central portion of the bottom surface of the first chips. For example, the conductive contacts are arranged in a row in a central portion of the bottom surface of the first chips. Other types of contact arrangements may also be useful.

The conductive contacts are coupled to the through silicon interconnects. In one embodiment, a RDL 347 with conductive lines is provided in the bottom surface of the first chips to couple the conductive contacts to the ends of the through silicon interconnects. The conductive lines of the RDL comprises, for example, copper or copper alloy. Other types of conductive materials may also be used to form the conductive lines.

The first chips are temporarily mounted onto the assembly surface of the base carrier. In one embodiment, bottom surfaces of the first chips are temporarily mounted onto the assembly surface of the base carrier. The first chips are mounted by a process similar to that described in, for example, FIG. 1b.

Figure 3C:
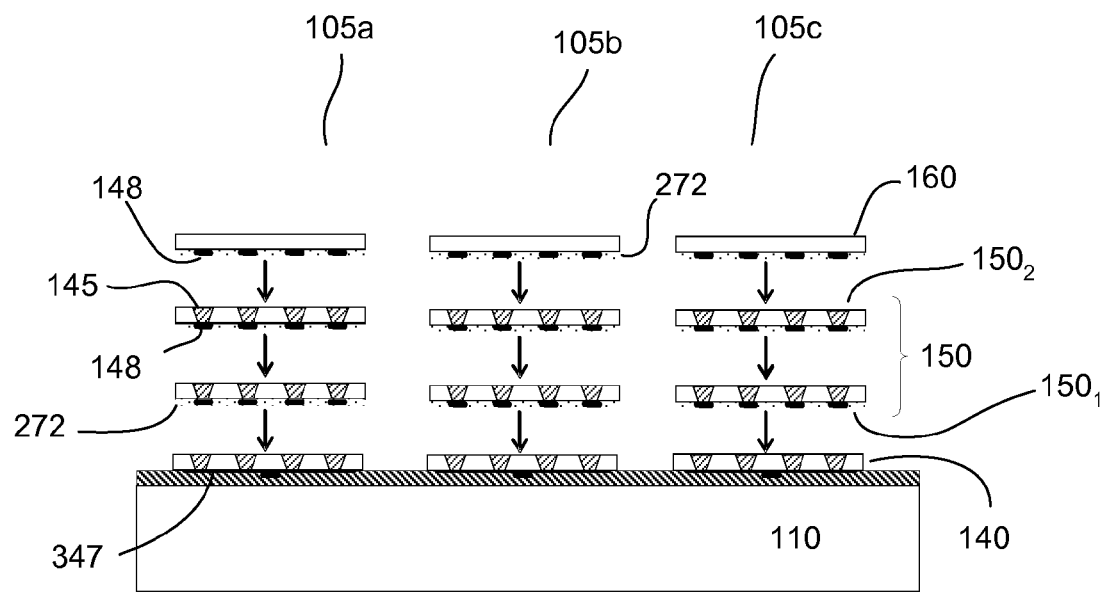

As shown in FIG. 3c, additional chips of the chip stacks are provided. In one embodiment, second or intermediate chips of the chip stacks may be provided. Illustratively, two intermediate chips $150_1$ and $150_2$ are provided for a chip stack. Providing other number of intermediate chips for a stack, including zero, may be also useful.

The intermediate chips, in one embodiment, comprise through silicon interconnects 145 and contacts 148 on their bottom surfaces. As shown, the contacts are directly coupled to the through silicon interconnects. Providing contacts which are indirectly coupled to the through silicon interconnects may also be useful. In one embodiment, a top surface of the intermediate chips is exposed. The exposed surface includes the ends of the through silicon interconnects.

In one embodiment, bottom surfaces of the second chips are provided with an underfill 272. The underfill layer may be applied to the bottom surfaces of the intermediate chips. The underfill layer may be substantially flushed with the conductive contacts 148. The underfill layer, for example, can comprise a resin. Other types of material can also be useful. The underfill layer preferably has a low coefficient of thermal expansion (CTE) to avoid or reduce warpage of the chips of the chip assemblies. The CTE of the resin may be the same or close to that of the chip. For example, the CTE of the resin may be the same or close to that of silicon. Providing an underfill layer with other CTEs may also be useful. In one embodiment, the resin comprises an epoxy resin mold compound. Other kinds of underfill compositions may also be useful.

In one embodiment, third or top chips 160 are provided for the chip stacks. Top chips at least include conductive contacts 148 on its bottom surface. An underfill layer 272 may be applied to the bottom surfaces of the top chips. Illustratively, the top chips do not include through silicon interconnects. In other embodiments, the top chips may be provided with through silicon interconnects. In such case, the top chips may be similar or identical to the intermediate chips. The top surface of the top chips, in one embodiment, is exposed.

The $n^{th}$ chip of the chip stack, where $n \neq 1$ is placed on the $n^{th}-1$ chip. For example, the conductive contacts of the $n^{th}$ chip is placed and aligned with the through silicon interconnects of the $n^{th}-1$ chip. In an alternative embodiment, an RDL may be provided on either the top surface or bottom surface of the chip to facilitate alignment or coupling of conductive contacts of the $n^{th}$ chip to the through silicon interconnects of the $n^{th}-1$ chip.

The various chips of a chip stack assembly may be the same or different types of chips. Other configurations of the chips of the chip stack assembly may also be useful. For example, some of the chips may be different while others may be the same.

Figure 3D:
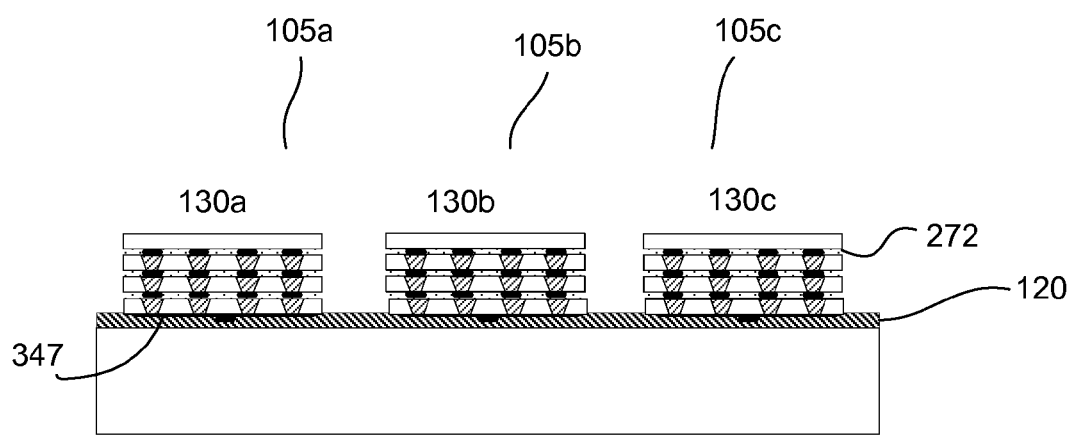

A chip bonding process is performed to form chip stack assemblies 130a-c, as shown in FIG. 3d. The chip bonding process is similar to that already described in, for example, FIG. 1d.

Figure 3E:
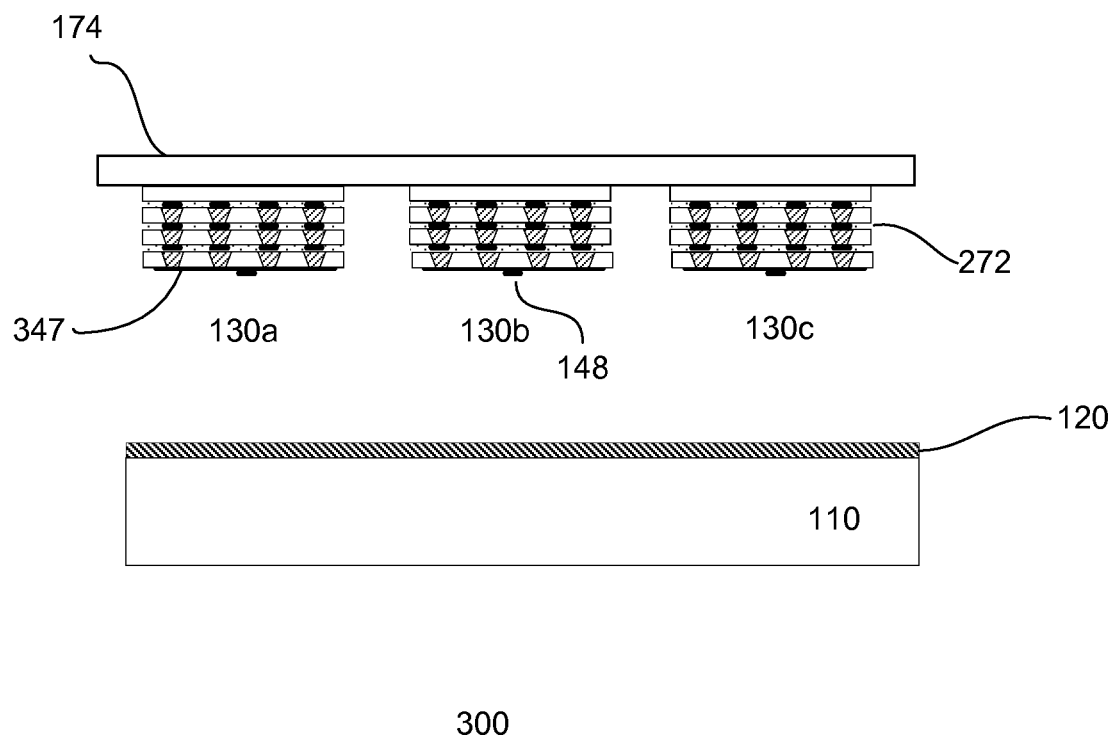

Referring to FIG. 3e, a de-bonding process is performed. The de-bonding process is similar to that described in, for example, FIG. 2e. To facilitate the de-bonding process, the top surfaces of the chip assemblies may be locked into a rigid frame 174. The rigid frame is lifted to separate the chip assemblies from the base carrier. The rigid frame can be, for example, a wafer chuck for de-bonding. The base carrier 110 may be cleaned thereafter to remove the adhesive, and be recycled for further use.

Figure 3F:
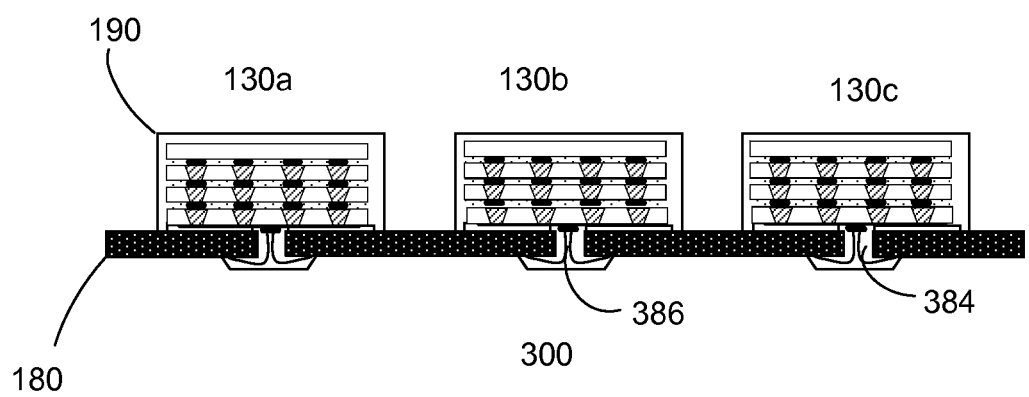

Referring to FIG. 3f, the stacked chip assemblies 130a-c may optionally be mounted onto a substrate 180. In one embodiment, the chip assemblies are mounted onto the substrate using an adhesive. Other types of bonding materials may also be used. The substrate can, for example, be a laminate substrate such as a bismaleimide triazine (BT) substrate. Other types of substrate can also be used.

Openings 384 which extend through the top and bottom surfaces of the substrate are provided. When the chip assemblies are mounted onto the top surface of the substrate, conductive contacts 148 of the bottom chips are positioned in the openings. Wire bonds 386 extend from the conductive contacts 148 through the aperture 384 and to the underside of the substrate to electrically connect the bottom chips 140 to the contact pads on the bottom surface of the substrate 180. The wire bonds are comprised of copper. Other materials can also be used.

The stacked chip assemblies are encapsulated in a mold compound 190. The mold compound also occupies space between the bottom chip 140 and the substrate 180 and covers the conductive contacts 148 therebetween. The mold compound comprises a material used for encapsulating semiconductor devices. Various types of mold compounds can be used, for example, plastic molding compounds or rubber molding compounds may be used to encapsulate the chip assemblies.

Figure 3G:
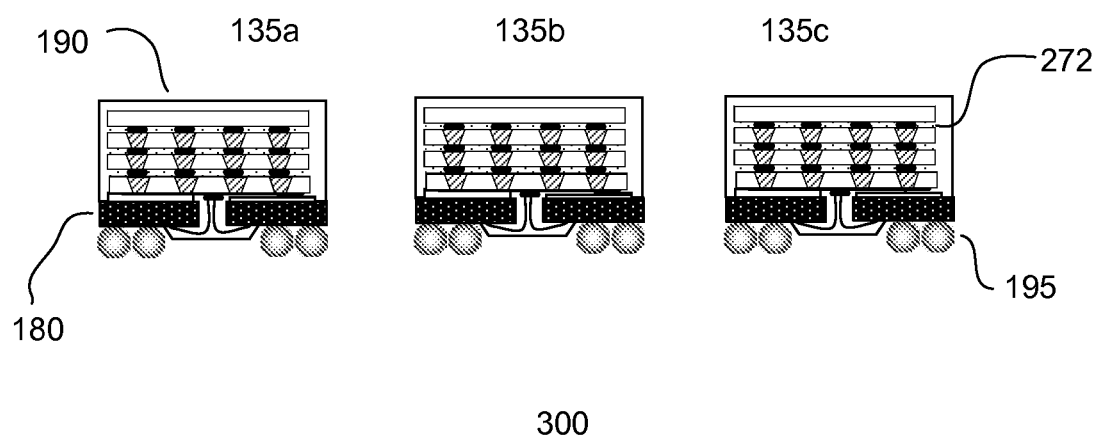

As shown in FIG. 3g, package contacts 195, such as solder balls, are provided on the bottom surface of the substrate 180. The package contacts are electrically coupled to the contact pads on the bottom of the substrate, for example, by conductive lines. The package contacts enable electrical connection to an external device such as a circuit board. The solder balls can be in different alloy, for example, Sn—Ag or Sn—Cu. Other materials can also be used. The solder balls can be attached to the bottom surface of the substrate by heating or laser soldering. Other methods can also be useful. The substrate 180 is singulated to form individual semiconductor packages 135a-c.

As such, a stacked die semiconductor package is formed. It will be appreciated that the individual chip assemblies need not be mounted onto the substrate and may be directly connected to the external device such as a circuit board, depending on the applications of the chips.

The process described in FIGS. 3a-g has the same advantages those of FIGS. 1a-i and FIGS. 2a-g. Additionally, the process enables flexibility in integrating the stacked chip assemblies with the desired bottom chip conductive contact layout and substrate design.

In alternative embodiments, no underfill layer may be provided on the bottom surface of the intermediate and top chips. In such application, a resin may be provided to fill at least the space between the chips of the chip stack and gaps between the chip assemblies, as described in, for example, FIGS. 1d-f. The process continues after singulation as described in, for example, FIGS. 3f-g.

Figure 4A:
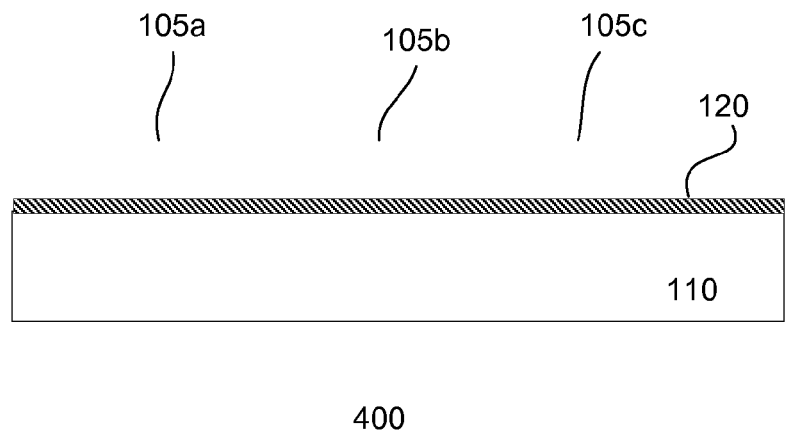
FIGS. 4a-h show another process of forming a semiconductor package.

FIGS. 4a-h show another embodiment of a process 400 for forming a semiconductor or chip assembly. In one embodiment, the chip assembly comprises a stacked chip assembly. Referring to FIG. 4a, a substrate 110 is provided with an adhesive 120 on a chip assembly surface thereof. The substrate with the adhesive is similar to that described in, for example, FIG. 1a. The adhesive is used to temporarily bond a chip assembly to the chip assembly surface. Alternatively, other temporary bonding techniques may be employed to temporarily bond a chip assembly to the carrier.

Figure 4B:
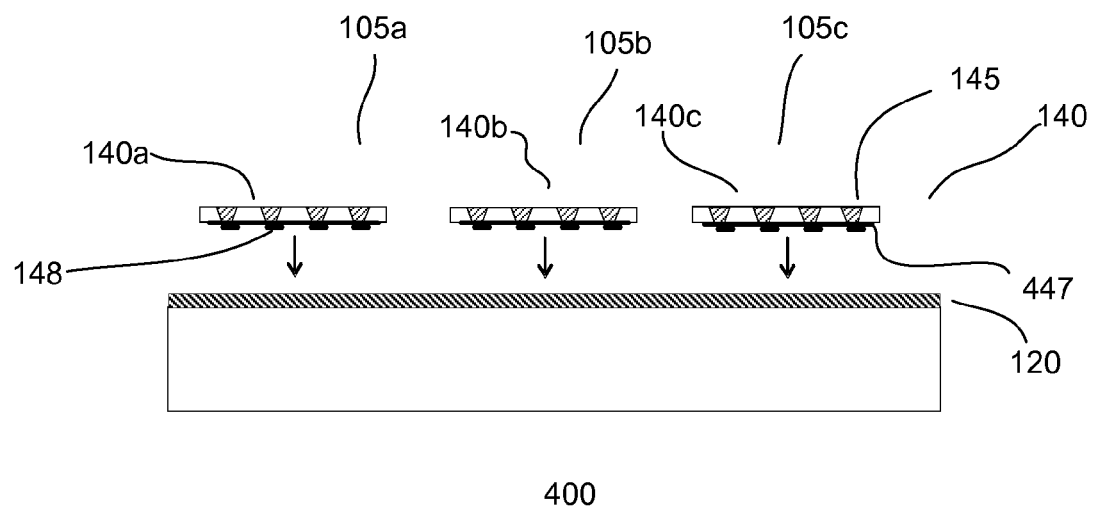

In FIG. 4b, first chips 140a-c are provided. The first chip serves as a bottom or lowest chip of a chip stack. In one embodiment, a bottom chip includes through silicon interconnects 145 extending from a first surface to an opposing second surface of the chip. The first surface, for example, is the top surface and the second surface is the bottom surface. The through silicon interconnects may be formed using various techniques. For example, the through silicon interconnects may be formed by forming vias through the chip and filling the vias with a conductive material, such as copper. Forming the through silicon interconnects using other techniques or using other types of conductive materials may also be useful. A through silicon interconnect may be formed in any location on the chip. The location may depend on, for example, the chip layout or design requirements.

Conductive contacts 148 are provided on the first or second surface. In one embodiment, the conductive contacts are provided on the bottom surface of the first chips. The conductive contacts can, for example, be a ball bump made of solder. Other types of conductive contacts may also be useful. For example, the conductive contacts can also be conductive pads made of copper, tin, gold or alloys thereof. Other materials can also be used.

The conductive contacts are coupled to the through silicon interconnects. In one embodiment, a RDL 447 with conductive lines is provided in the bottom surface of the first chips to couple the conductive contacts to the ends of the through silicon interconnects. In one embodiment, the conductive lines comprise metallic conductive lines, such as copper or copper alloy. Other types of materials may be used to form the conductive lines. The conductive lines can be employed to, for example, electrically route finer pitch through silicon interconnects to larger pitch conductive contacts. In other embodiments, the conductive contacts may be directly coupled to the through silicon interconnects.

The RDL may include a passivation layer which covers the conductive lines but expose the conductive contacts. The passivation layer, for example, may be an insulating layer of glass and silicon nitride or a silicon-rich nitride film processed by a plasma enhanced chemical vapor deposition (PECVD). Other types of materials can also be used.

The first chips are temporarily mounted onto the assembly surface of the base carrier. In one embodiment, bottom surfaces of the first chips are temporarily mounted onto the assembly surface of the base carrier. The first chips are mounted by a process similar to that described in, for example, FIG. 1b.

Figure 4C:
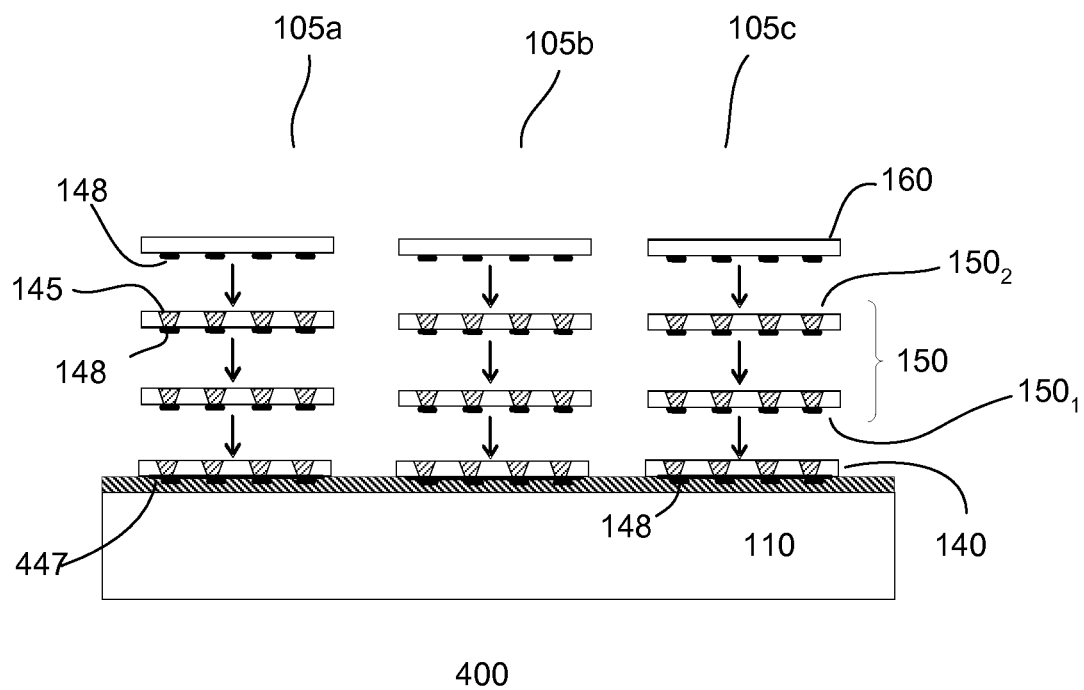

As shown in FIG. 4c, additional chips of the chip stacks are provided. The additional chips provided are similar to those described in, for example, FIG. 1c. Illustratively, two intermediate chips $150_1$ and $150_2$ and top chip 160 are provided for a chip stack. Providing other number of intermediate chips for a stack, including zero, may also be useful. The various chips of a chip stack assembly may be the same or different types of chips. Other configurations of the chips of the chip stack assembly may also be useful. For example, some of the chips may be different while others may be the same.

Figure 4D:
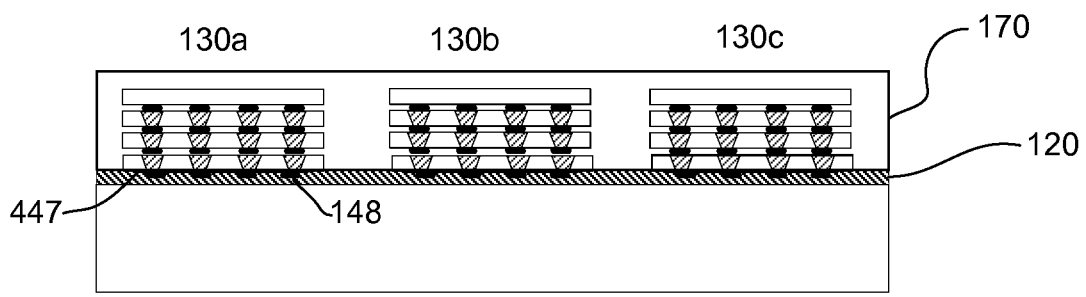

A chip bonding process is performed to bond the chips of the chip stack together to form chip stack assemblies 130a-c, as shown in FIG. 4d. The chip bonding process is similar to that described in, for example, FIG. 1d.

In one embodiment, a resin 170 is provided into spaces between the stacked chip assemblies. The resin may also underfill gaps between each pair of chips in the stacked chip assembly and enclose the conductive contacts. As shown, the resin covers the top surface of the top chips. In alternative embodiments, the resin may comprise a top surface which is coplanar with the top surface of the chip assemblies. The resin may have a low coefficient of thermal expansion (CTE) to avoid or reduce warpage of the chip assembly. The CTE of the resin may be the same or close to that of the chip. For example, the CTE of the resin may be the same or close to that of silicon. Other CTEs may also be useful. In one embodiment, the resin comprises an epoxy resin mold compound. Other kinds of mold compositions may also be useful.

Figure 4E:
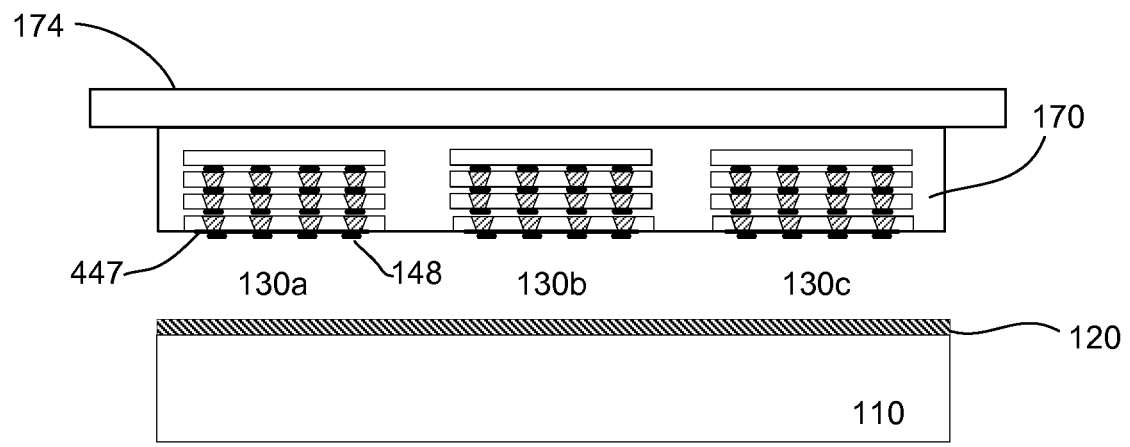

Referring to FIG. 4e, a de-bonding process is performed. The de-bonding process is similar to that described in, for example, FIG. 1e. To facilitate the de-bonding process, the top surfaces of the chip assemblies may be locked into a rigid frame 174. The rigid frame is lifted to separate the chip assemblies from the base carrier. The rigid frame can be, for example, a wafer chuck for de-bonding. The base carrier 110 may be cleaned thereafter to remove the adhesive, and be recycled for further use.

Figure 4F:
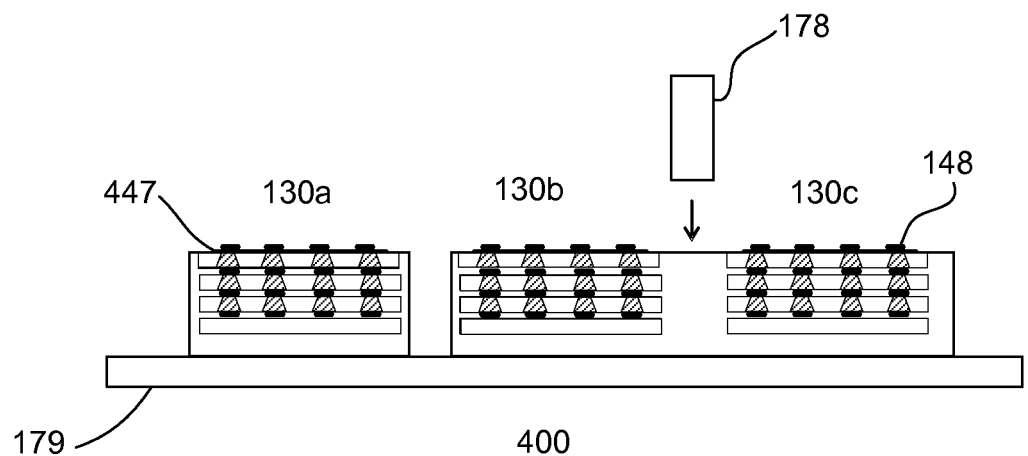
Figure 4G:
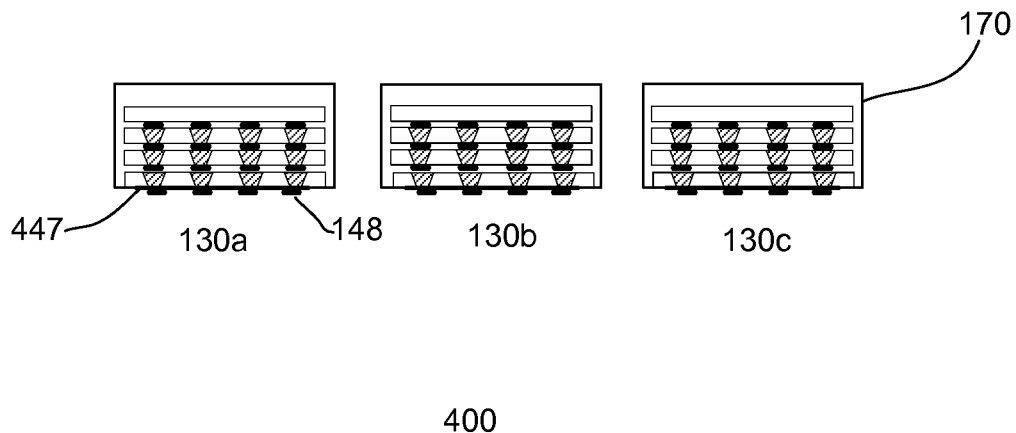

As shown in FIG. 4*f*, a singulation process is performed to form individual chip assemblies 130*a-c*. In one embodiment, the chip assemblies with the resin are mounted onto a dicing ring 179. To mount the chip assemblies onto the dicing ring, a dicing tape may be employed. A saw 178 saws the resin between the chip assemblies, separating them. Other techniques can also be used for singulation. FIG. 4*g* shows the stacked chip assemblies 130*a-c* after completing the singulation process.

Figure 4H:
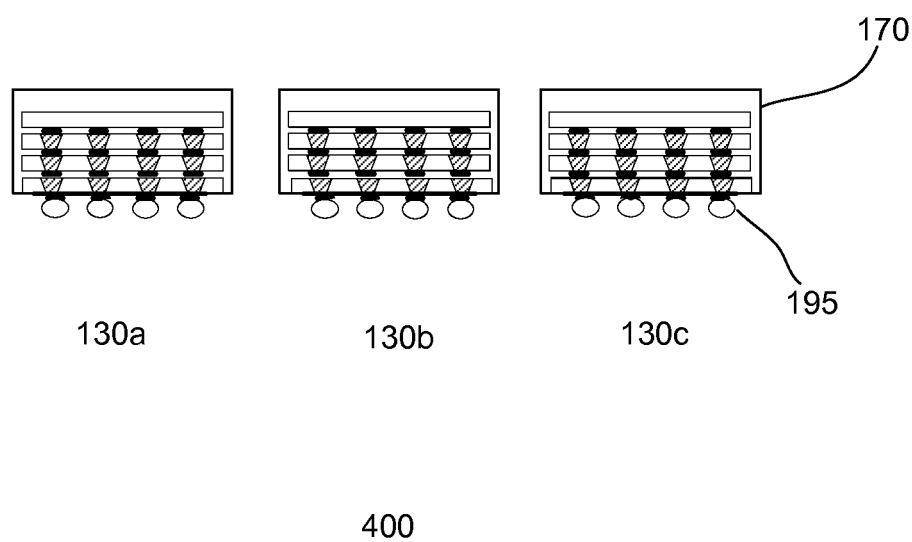

Referring to FIG. 4*h*, solder balls 195 are provided on the conductive contacts to form a semiconductor package. The solder balls can be in different alloy, for example, Sn—Ag or Sn—Cu. Other materials can also be used. The solder balls can be attached to the bottom surface of the substrate by heating or laser soldering. Other methods can also be useful. The resin may serve as an encapsulation for the chip assemblies. The semiconductor package may be electrically connected to an external device such as a circuit board.

Alternatively, the stacked chip assemblies may be provided onto a substrate and encapsulated before connection to the external device, for example, as described in FIGS. 1*h-i*.

As such, a stacked die semiconductor package is formed. The process described in FIGS. 4*a-g* provides similar advantages as those of, for example, FIGS. 1*a-i*.

Figure 5A:
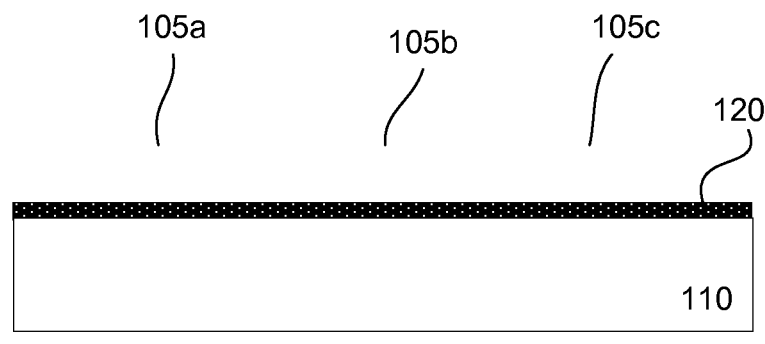
FIGS. 5a-j show yet another process of forming a semiconductor package.

FIGS. 5*a-j* show another embodiment of a process 500 for forming a semiconductor or chip assembly. In one embodiment, the chip assembly comprises a stacked chip assembly. Referring to FIG. 5*a*, a substrate 110 is provided with an adhesive 120 on a chip assembly surface thereof. The substrate with the adhesive is similar to that described in, for example, FIG. 1*a*. The adhesive is used to temporarily bond a chip assembly to the chip assembly surface. Alternatively, other temporary bonding techniques may be employed to temporarily bond a chip assembly to the carrier.

Figure 5B:
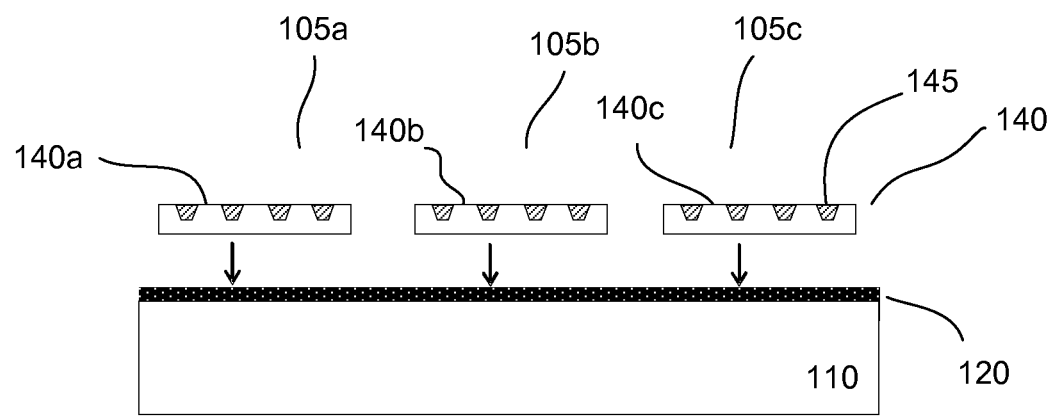

In FIG. 5*b*, first chips 140*a-c* are provided. The first chip serves as a bottom or lowest chip of a chip stack. The bottom chip includes first and second surfaces. In one embodiment, a thickness $T_T$ of the bottom chip between the first and second surfaces is thicker than the intended or final thickness $T_F$. In one embodiment, a bottom chip includes partial through silicon interconnects 145 extending from a first surface to a depth less than $T_T$. The first surface, for example, is the top surface. The partial through silicon interconnects may be formed using various techniques. For example, the partial through silicon interconnects may be formed by forming vias partially through the chip and filling the vias with a conductive material, such as copper. Forming the through silicon interconnects using other techniques or using other types of conductive materials may also be useful. A through silicon interconnect may be formed in any location on the chip. The location may depend on, for example, the chip layout or design requirements.

The first chips are temporarily mounted onto the assembly surface of the base carrier. In one embodiment, bottom surfaces of the first chips are temporarily mounted onto the assembly surface of the base carrier. The first chips are mounted by a process similar to that described in, for example, FIG. 1*b*.

Figure 5C:
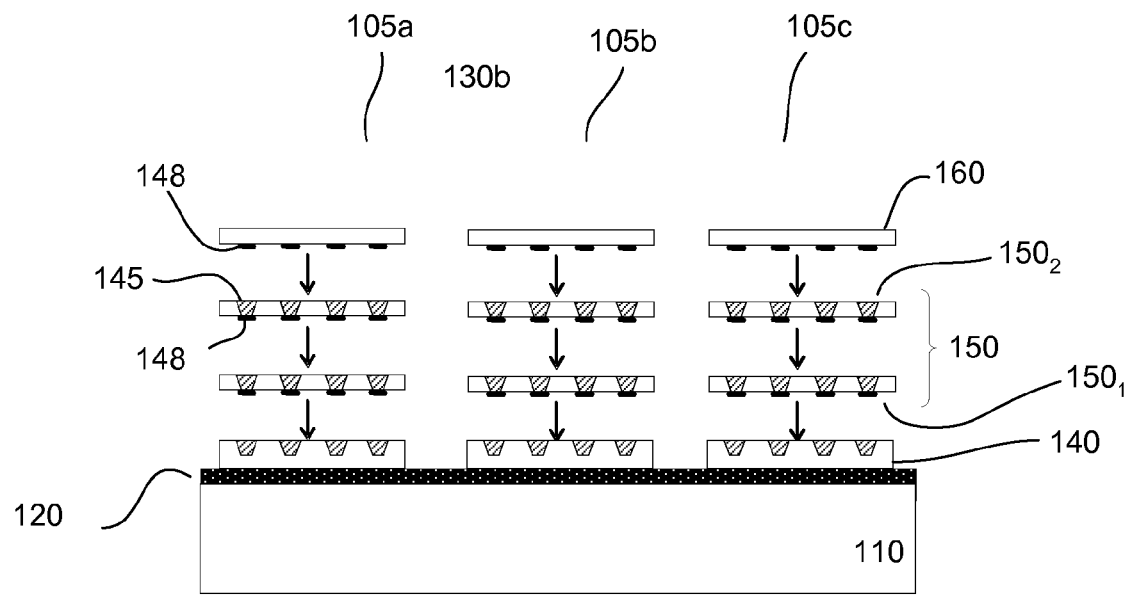

As shown in FIG. 5*c*, additional chips of the chip stacks are provided. The additional chips provided are similar to those described in, for example, FIG. 1*c*. Illustratively, two intermediate chips 150$_1$ and 150$_2$ and top chip 160 are provided for a chip stack. Providing other number of intermediate chips for a stack, including zero, may also be useful. The various chips of a chip stack assembly may be the same or different types of chips. Other configurations of the chips of the chip stack assembly may also be useful. For example, some of the chips may be different while others may be the same.

Figure 5D:
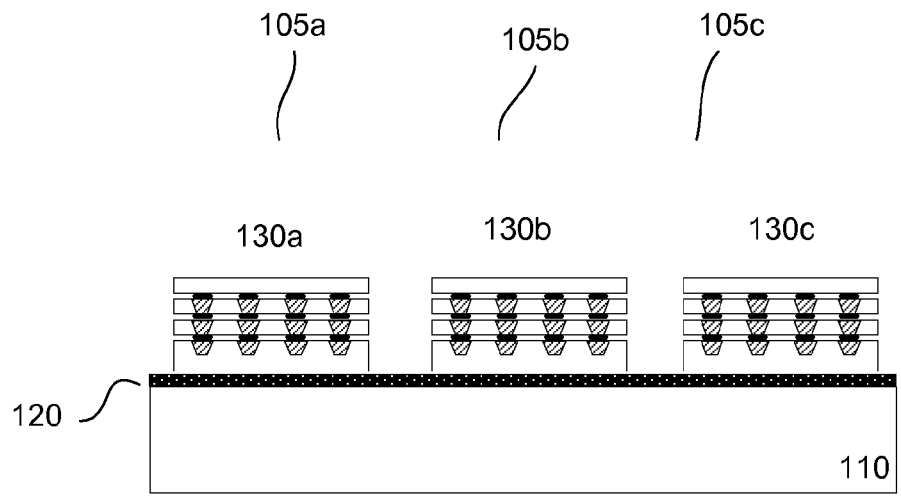

A chip bonding process is performed to bond the chips of the chip stack together to form chip stack assemblies 130*a-c*, as shown in FIG. 5*d*. The chip bonding process is similar to that described in, for example, FIG. 1*d*.

Figure 5E:
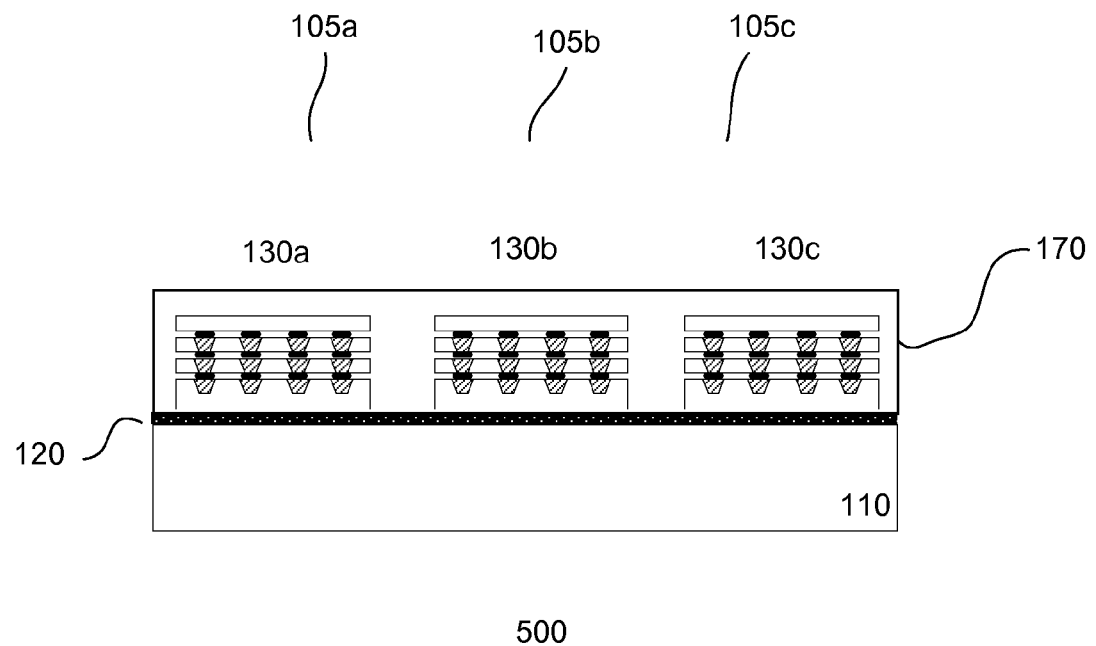

In one embodiment, a resin 170 is provided into spaces between the stacked chip assemblies, as shown in FIG. 5*e*. The resin may also underfill gaps between each pair of chips in the stacked chip assembly and enclose the conductive contacts. As shown, the resin covers the top surface of the top chips. In alternative embodiments, the resin may comprise a top surface which is coplanar with the top surface of the chip assemblies. The resin may have a low coefficient of thermal expansion (CTE) to avoid or reduce warpage of the chip assembly. The CTE of the resin may be the same or close to that of the chip. For example, the CTE of the resin may be the same or close to that of silicon. Other CTEs may also be useful. In one embodiment, the resin comprises an epoxy resin mold compound. Other kinds of mold compositions may also be useful.

Figure 5F:
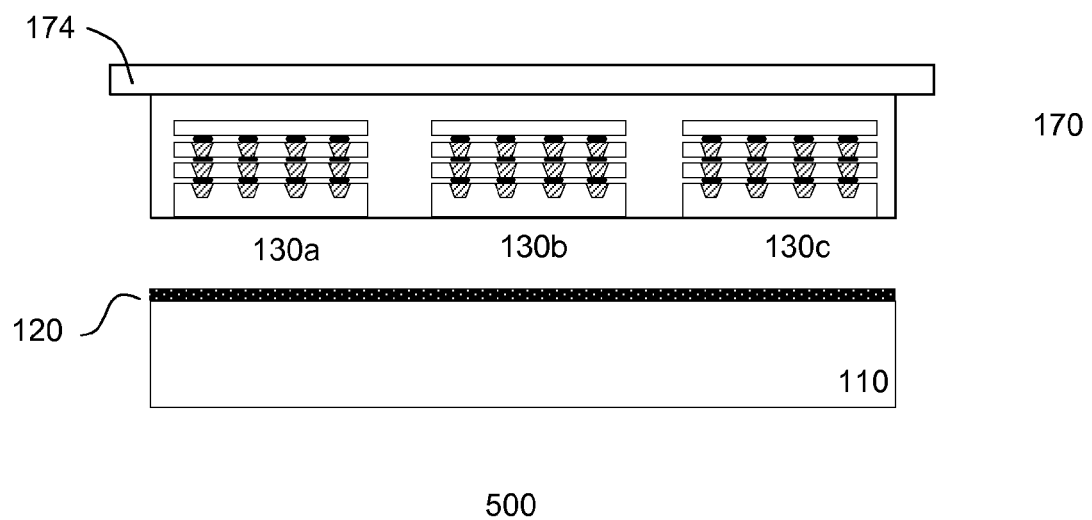

Referring to FIG. 5*f*, a de-bonding process is performed. The de-bonding process is similar to that described in, for example, FIG. 1*e*. To facilitate the de-bonding process, the top surfaces of the chip assemblies may be locked into a rigid frame 174. The rigid frame is lifted to separate the chip assemblies from the base carrier. The rigid frame can be, for example, a wafer chuck for de-bonding. The base carrier 110 may be cleaned thereafter to remove the adhesive, and be recycled for further use.

Figure 5G:
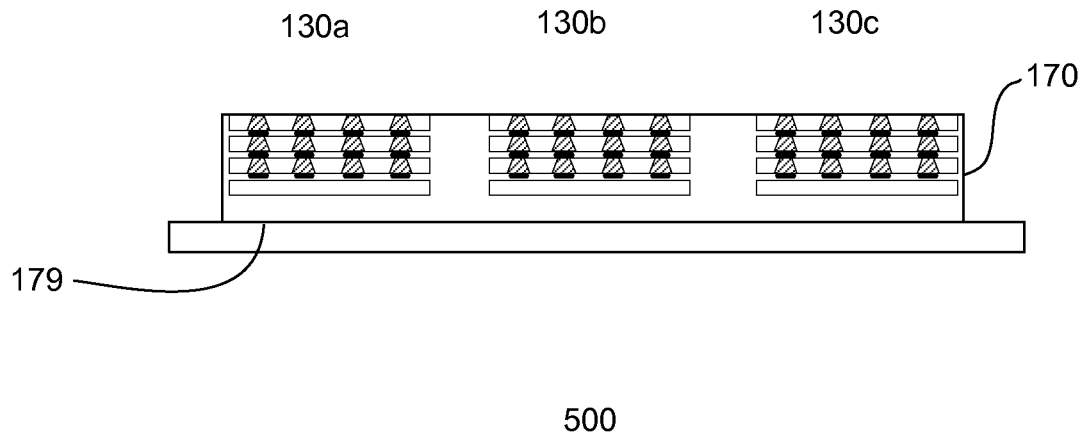

In FIG. 5*g*, the bottom surfaces of the chip assemblies and resin are thinned to expose the bottom of the through silicon interconnects. Thinning of the bottom surface of the bottom chips may be achieved by various techniques. For example, the bottom surface of the bottom chips may be thinned by wet or dry etching, wet or dry polishing or chemical mechanical polishing. Other techniques for thinning the bottom surface of the bottom chips may also be employed.

Figure 5H:
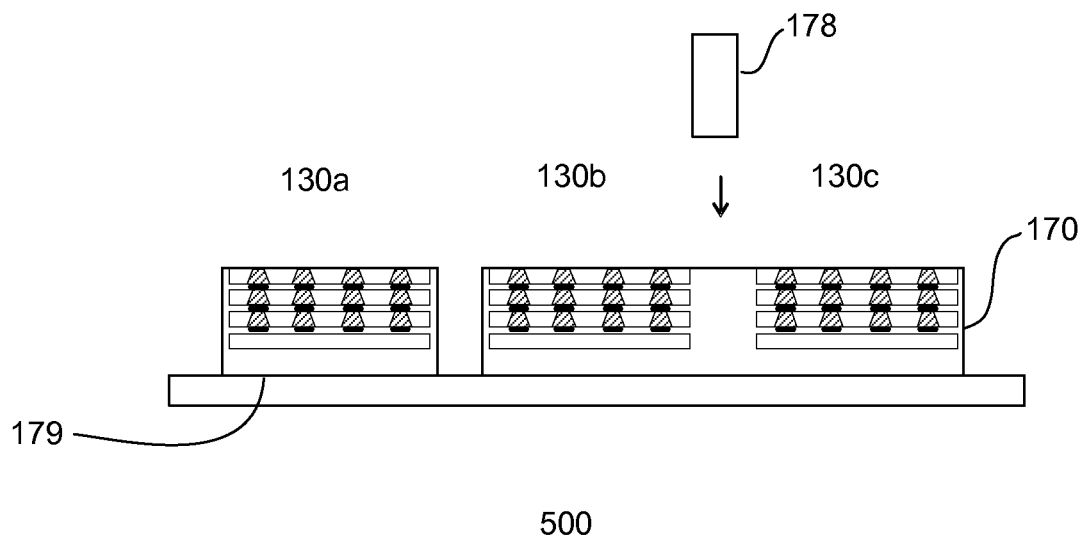

In one embodiment, as shown in FIG. 5*h*, a singulation process is performed to form individual chip assemblies 130*a-c*. In one embodiment, the chip assemblies with the resin are mounted onto a dicing ring 179. To mount the chip assemblies onto the dicing ring, a dicing tape may be employed. A saw 178 saws the resin between the chip assemblies, separating them. Other techniques can also be used for singulation.

Figure 5I:
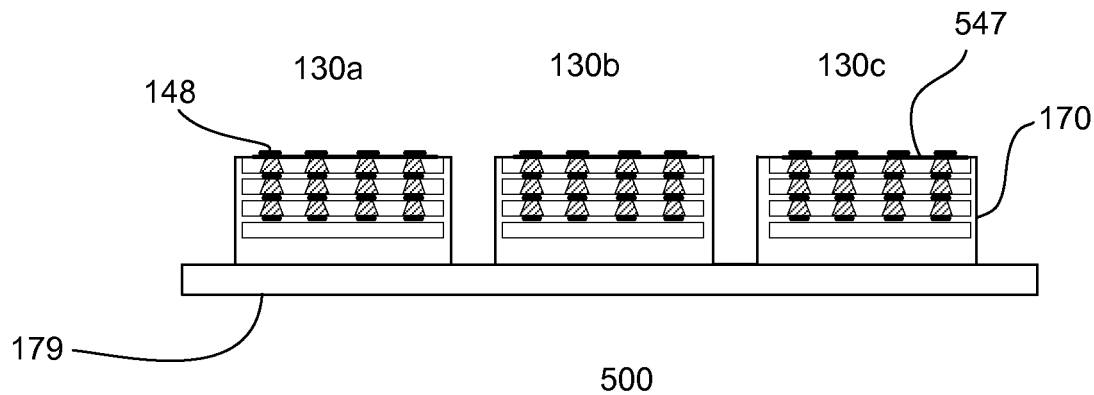

Referring to FIG. 5*i*, conductive contacts 148 are provided in the bottom surfaces of the bottom chips of the chip assemblies. The conductive contacts can, for example, be a ball bump made of solder. Other types of conductive contacts may also be useful. For example, the conductive contacts can also be conductive pads made of copper, tin, gold or alloys thereof. Other materials can also be used.

The conductive contacts are coupled to the through silicon interconnects. In one embodiment, a RDL 547 with conductive lines is provided on the bottom surface of the first chips to couple the conductive contacts to the ends of the through silicon interconnects. In one embodiment, the conductive lines comprise metallic conductive lines, such as copper or copper alloy. Other types of materials may be used to form the conductive lines. The conductive lines can be employed to, for example, electrically route finer pitch through silicon interconnects to larger pitch conductive contacts. In other embodiments, the conductive contacts may be directly coupled to the through silicon interconnects.

The RDL may include a passivation layer which covers the conductive lines but exposes the conductive contacts. The passivation layer, for example, may be an insulating layer of glass and silicon nitride or a silicon-rich nitride film processed by a plasma enhanced chemical vapor deposition (PECVD). Other types of materials can also be used.

Figure 5J:
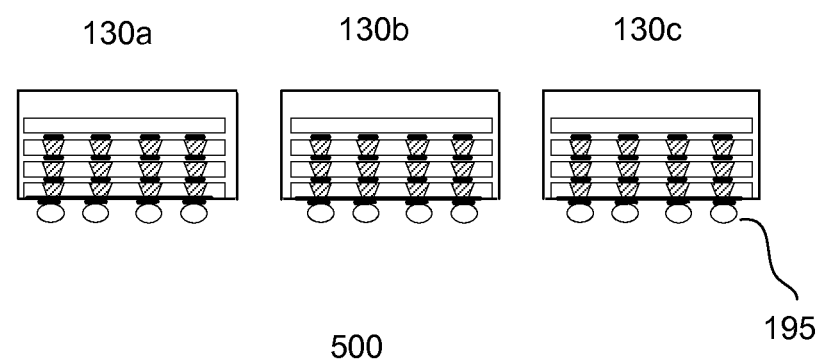

In FIG. 5j, solder balls 195 are provided on the conductive contacts to form a semiconductor package. The solder balls can be in different alloy, for example, Sn—Ag or Sn—Cu. Other materials can also be used. The solder balls can be attached to the bottom surface of the substrate by heating or laser soldering. Other methods can also be useful. The resin may serve as an encapsulation for the chip assemblies. The semiconductor package may be electrically connected to an external device such as a circuit board.

Alternatively, the stacked chip assemblies may be provided onto a substrate and encapsulated before connection to the external device, for example, as described in FIGS. 1h-i.

As such, a stacked die semiconductor package is formed. The process described in FIGS. 5a-j provides similar advantages as those of, for example, FIGS. 1a-i.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming devices comprising:
providing a temporary substrate having a temporary mounting surface;
providing a plurality of first and second singulated chips, wherein a singulated chip is a chip singulated from a wafer having a plurality of chips prior to temporarily mounting the plurality of first singulated chips to the temporary mounting surface;
temporarily mounting the plurality of first singulated chips to the temporary mounting surface, a first singulated chip includes a first bottom surface and a first top surface with first interconnects, wherein first bottom surfaces of the first singulated chips are temporarily mounted to the temporary mounting surface;
stacking the second singulated chips on the first top surfaces of the first singulated chips, a second singulated chip includes a second bottom surface with second conductive contacts, wherein the second conductive contacts of the second singulated chips are coupled to the first interconnects on the first top surfaces of the first singulated chips;
bonding the first and second singulated chips together to form a plurality of chip stacks; and
separating the first bottom surfaces of the first singulated chips from the temporary substrate to separate the chip stacks from the temporary substrate.

2. The method of claim 1 comprises:
depositing a resin on the temporary substrate, the resin filling a gap between chips of the chip stacks, the resin coupling the plurality of chip stacks together; and
separating the plurality of chip stacks coupled by the resin into individual chip stacks.

3. The method of claim 2 comprises forming package contacts on the first bottom surfaces of the first singulated chips of the chip stacks to form devices.

4. The method of claim 2 comprises:
providing a package substrate having a first surface and a second surface, wherein the package substrate comprises first contact pads on the first surface;
mounting the plurality of chip stacks onto the first surface of the package substrate, wherein conductive contacts on the first bottom surfaces of the first singulated chips of the chip stacks are coupled to the first contact pads of the package substrate;
forming package contacts on the second surface of the package substrate, wherein the package contacts are coupled to the first contact pads on the first surface of the package substrate; and
separating the package substrate with the plurality of chip stacks to form individual devices.

5. The method of claim 4 comprises encapsulating the chip stacks prior to separating the package substrate to form individual devices.

6. The method of claim 2 wherein a top surface of the resin is coplanar with top surfaces of top chips of the chip stacks.

7. The method of claim 2 wherein a top surface of the resin is above top surfaces of top chips of the chip stacks.

8. The method of claim 1 wherein:
the second bottom surfaces of the second singulated chips comprise an underfill; and
separating the chip stacks from the temporary substrate to form individual chip stacks.

9. The method of claim 8 comprises forming package contacts on the first bottom surfaces of the first singulated chips of the chip stacks to form devices.

10. The method of claim 8 comprises:
providing a package substrate having a first surface and a second surface, wherein the package substrate comprises first contact pads on the first surface;
mounting the plurality of chip stacks onto the first surface of the package substrate, wherein conductive contacts on the first bottom surfaces of the first singulated chips of the chip stacks are coupled to the first contact pads of the package substrate;
forming package contacts on the second surface of the package substrate, wherein the package contacts are coupled to the first contact pads on the first surface of the package substrate; and
separating the package substrate with the plurality of chip stacks to form individual devices.

11. The method of claim 10 comprises encapsulating the chip stacks prior to separating the package substrate to form individual devices.

12. A method of forming devices comprising:
providing a temporary substrate having a temporary mounting surface;
temporarily mounting a plurality of first chips to the temporary mounting surface, a first chip includes a first bottom surface and a first top surface with first interconnects, wherein first bottom surfaces of the first chips are temporarily mounted to the temporary mounting surface, and the first chips comprise first partial through silicon interconnects having top ends through first top surfaces of the first chips while bottom ends of the through silicon interconnects are not exposed;
stacking second chips on the first top surfaces of the first chips, a second chip includes a second bottom surface with second conductive contacts, wherein the second conductive contacts of the second chips are coupled to the first interconnects on the first top surfaces of the first chips;

bonding the first and second chips together to form a plurality of chip stacks;

separating the first bottom surfaces of the first chips from the temporary substrate to separate the chip stacks from the temporary substrate;

performing a thinning process on the first bottom surfaces of the first chips to expose bottom ends of the through silicon interconnects after separating the first chips from the temporary substrate; and forming conductive contacts on thinned first bottom surfaces of the first chips, the conductive contacts are coupled to the bottom ends of the through silicon interconnects.

13. The method of claim 1:

wherein the second singulated chip comprises second through silicon interconnects through the second top and bottom surfaces of the second singulated chip, the second conductive contacts on the second bottom surface are coupled to second interconnects on the second top surface;

further comprises stacking third singulated chips onto the second singulated chips, a third singulated chip includes a third bottom surface with third conductive contacts, wherein the third conductive contacts of the third singulated chips are coupled to the second interconnects on the second top surfaces of the second singulated chips; and wherein the chip stacks comprise first, second and third singulated chips.

14. The method of claim 1 wherein the first singulated chips are temporarily mounted to the substrate by an adhesive.

15. The method of claim 14 wherein separating the first singulated chips from the substrate comprises heating the adhesive.

16. The method of claim 14 wherein separating the first singulated chips from the substrate comprises a temperature, chemical or mechanical process or a combination thereof.

17. The method of claim 1 wherein separating the first singulated chips from the substrate comprises a temperature, chemical or mechanical process or a combination thereof.

18. A method of forming a device stack comprising:

providing a temporary substrate having a temporary mounting surface;

providing first and second singulated chips, wherein a singulated chip is a chip singulated from a wafer having a plurality of chips prior to temporarily mounting the first singulated chip to the temporary mounting surface;

temporarily mounting the first singulated chip to the temporary mounting surface, wherein a first bottom surface of the first singulated chip is temporarily mounted to the temporary mounting surface and a first top surface of the first singulated chip comprises first interconnects;

stacking the second singulated chip on the first singulated chip, the second singulated chip includes second conductive contacts on the second bottom surface;

bonding the first and second singulated chips together to form the device stack, wherein the second conductive contacts are coupled to the first interconnects; and separating the first bottom surface of the first singulated chip from the substrate to separate the chip stack from the substrate.

19. A method of forming devices comprising:

providing a temporary substrate having a temporary mounting surface;

providing a plurality of first, second and third singulated chips, wherein a singulated chip is a chip singulated from a wafer having a plurality of chips prior to temporarily mounting the plurality of first singulated chips to the temporary mounting surface;

temporarily mounting the plurality of first singulated chips to the temporary mounting surface, a first singulated chip includes a first bottom surface and a first top surface with first interconnects, wherein first bottom surfaces of the first singulated chips are temporarily mounted to the temporary mounting surface;

stacking the second singulated chips on the first top surfaces of the first singulated chips, a second singulated chip includes a second bottom surface with second conductive contacts and a second top surface with second interconnects, the second conductive contacts coupled to the second interconnects by second through silicon interconnects, wherein the second conductive contacts of the second singulated chips are coupled to the first interconnects on the first top surfaces of the first singulated chips;

stacking the third singulated chips on top surfaces of the second singulated chips, a third singulated chip includes a third bottom surface with third conductive contacts, wherein the third conductive contacts of the third singulated chips are coupled to the second interconnects on the second top surfaces of the second singulated chips;

bonding the first, second and third singulated chips together to form a plurality of chip stacks; and separating the first bottom surfaces of the first singulated chips from the temporary substrate to separate the chip stacks from the temporary substrate.

20. The method of claim 19 comprises:

depositing a resin on the temporary substrate, the resin filling a gap between chips of the chip stack, the resin coupling the plurality chip stacks together; and separating the plurality of chip stacks coupled by the resin into individual chip stacks.

21. The method of claim 1 comprises:

providing conductive contacts on the first bottom surfaces of the first singulated chips, the conductive contacts are disposed in a central portion of the first bottom surfaces of the first singulated chips; and providing a redistribution layer (RDL) on the first bottom surfaces of the first singulated chips, wherein the RDL couples the conductive contacts to the first interconnects.

22. The method of claim 21 comprises:

providing an underfill to the second bottom surfaces of the second singulated chips; and separating the chip stacks from the temporary substrate to form individual chip stacks.

23. The method of claim 22 comprises:

providing a package substrate having a first surface and a second surface, wherein the package substrate comprises contact pads on the second surface and openings which extend through the first and second surfaces of the package substrate;

mounting the plurality of chip stacks onto the first surface of the package substrate, wherein conductive contacts on the first bottom surfaces of the first singulated chips of the chip stacks are coupled to the contact pads of the package substrate via wire bonds which extend from the conductive contacts through the openings;

forming package contacts on the second surface of the package substrate, wherein the package contacts are coupled to the contact pads on the second surface of the package substrate; and separating the package substrate with the plurality of chip stacks to form individual devices.

* * * * *